United States Patent
Bower et al.

(10) Patent No.: US 10,395,966 B2
(45) Date of Patent: *Aug. 27, 2019

(54) MICRO-TRANSFER-PRINTABLE FLIP-CHIP STRUCTURES AND METHODS

(71) Applicant: X-Celeprint Limited, Cork (IE)

(72) Inventors: Christopher Bower, Raleigh, NC (US); Matthew Meitl, Durham, NC (US); António José Marques Trindade, Cork (IE); Ronald S. Cok, Rochester, NY (US); Brook Raymond, Cary, NC (US); Carl Prevatte, Raleigh, NC (US)

(73) Assignee: X-Celeprint Limited, Cork (IE)

(*) Notice: Subject to any disclaimer, the term of this patent is extended or adjusted under 35 U.S.C. 154(b) by 0 days.

This patent is subject to a terminal disclaimer.

(21) Appl. No.: 15/944,223

(22) Filed: Apr. 3, 2018

(65) Prior Publication Data
US 2018/0226287 A1 Aug. 9, 2018

Related U.S. Application Data

(63) Continuation-in-part of application No. 15/811,959, filed on Nov. 14, 2017, now Pat. No. 10,224,231.
(Continued)

(51) Int. Cl.
*H01L 21/683* (2006.01)
*H01L 21/67* (2006.01)
(Continued)

(52) U.S. Cl.
CPC .......... *H01L 21/6835* (2013.01); *B65G 47/91* (2013.01); *H01L 21/67144* (2013.01);
(Continued)

(58) Field of Classification Search
CPC combination set(s) only.
See application file for complete search history.

(56) References Cited

U.S. PATENT DOCUMENTS

| 4,322,735 A | 3/1982 | Sadamasa et al. |
| 4,330,329 A | 5/1982 | Hayashi et al. |

(Continued)

FOREIGN PATENT DOCUMENTS

| EP | 1548571 A1 | 6/2005 |
| GB | 2 496 183 A | 5/2013 |

(Continued)

OTHER PUBLICATIONS

Chesterfield, R. J. et al., 63.3:Multinozzle Printing: A Cost-effective Process for OLED Display Fabrication, SID 2009 Digest, vol. XL:Book II, 951-954.
(Continued)

*Primary Examiner* — Mamadou L Diallo
(74) *Attorney, Agent, or Firm* — William R. Haulbrook; Michael D. Schmitt; Choate, Hall & Stewart LLP

(57) ABSTRACT

In certain embodiments, a method of making a semiconductor structure suitable for transfer printing (e.g., micro-transfer printing) includes providing a support substrate and disposing and processing one or more semiconductor layers on the support substrate to make a completed semiconductor device. A patterned release layer and, optionally, a capping layer are disposed on or over the completed semiconductor device and the patterned release layer or capping layer, if present, are bonded to a handle substrate with a bonding layer. The support substrate is removed to expose the completed semiconductor device and, in some embodiments, a portion of the patterned release layer. In some embodiments, an entry path is formed to expose a portion of the patterned release layer. In some embodiments, the release layer is etched and the completed semiconductor devices transfer printed (e.g., micro-transfer printed) from the handle substrate to a destination substrate.

20 Claims, 29 Drawing Sheets

Related U.S. Application Data

(60) Provisional application No. 62/422,365, filed on Nov. 15, 2016.

(51) Int. Cl.
  *H01L 33/00* (2010.01)
  *H01L 33/62* (2010.01)
  *B65G 47/91* (2006.01)
  *H01L 25/075* (2006.01)
  *H01L 33/20* (2010.01)
  *H01L 33/38* (2010.01)

(52) U.S. Cl.
  CPC .......... *H01L 33/0095* (2013.01); *H01L 33/62* (2013.01); *H01L 25/0753* (2013.01); *H01L 33/20* (2013.01); *H01L 33/38* (2013.01); *H01L 2221/68318* (2013.01); *H01L 2221/68354* (2013.01); *H01L 2221/68363* (2013.01); *H01L 2221/68368* (2013.01); *H01L 2221/68381* (2013.01); *H01L 2224/95* (2013.01); *H01L 2224/95001* (2013.01); *H01L 2224/97* (2013.01); *H01L 2933/0016* (2013.01); *H01L 2933/0066* (2013.01)

(56) References Cited

U.S. PATENT DOCUMENTS

| | | | |
|---|---|---|---|
| 4,591,659 A | 5/1986 | Leibowitz |
| 5,173,759 A | 12/1992 | Anzaki et al. |
| 5,550,066 A | 8/1996 | Tang et al. |
| 5,563,470 A | 10/1996 | Li |
| 5,621,555 A | 4/1997 | Park |
| 5,625,202 A | 4/1997 | Chai |
| 5,629,132 A | 5/1997 | Suzuki et al. |
| 5,686,790 A | 11/1997 | Curtin et al. |
| 5,739,800 A | 4/1998 | Lebby et al. |
| 5,748,161 A | 5/1998 | Lebby et al. |
| 5,780,933 A | 7/1998 | Ohmori et al. |
| 5,815,303 A | 9/1998 | Berlin |
| 5,821,571 A | 10/1998 | Lebby et al. |
| 5,994,722 A | 11/1999 | Averbeck et al. |
| 6,025,730 A | 2/2000 | Akram et al. |
| 6,084,579 A | 7/2000 | Hirano |
| 6,087,680 A | 7/2000 | Gramann et al. |
| 6,142,358 A | 11/2000 | Cohn et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,392,292 B1 | 5/2002 | Morishita |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,422,716 B2 | 7/2002 | Henrici et al. |
| 6,424,028 B1 | 7/2002 | Dickinson |
| 6,466,281 B1 | 10/2002 | Huang et al. |
| 6,504,180 B1 | 1/2003 | Heremans et al. |
| 6,577,367 B2 | 6/2003 | Kim |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,825,559 B2 | 11/2004 | Mishra et al. |
| 6,828,724 B2 | 12/2004 | Burroughes |
| 6,853,411 B2 | 2/2005 | Freidhoff et al. |
| 6,897,855 B1 | 5/2005 | Matthies et al. |
| 6,933,532 B2 | 8/2005 | Arnold et al. |
| 6,936,855 B1 | 8/2005 | Harrah |
| 6,969,624 B2 | 11/2005 | Iwafuchi et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,169,652 B2 | 1/2007 | Kimura |
| 7,195,733 B2 | 3/2007 | Rogers et al. |
| 7,259,391 B2 | 8/2007 | Liu et al. |
| 7,288,753 B2 | 10/2007 | Cok |
| 7,394,194 B2 | 7/2008 | Cok |
| 7,402,951 B2 | 7/2008 | Cok |
| 7,420,221 B2 | 9/2008 | Nagai |
| 7,466,075 B2 | 12/2008 | Cok et al. |
| 7,479,731 B2 | 1/2009 | Udagawa |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,605,452 B2 | 10/2009 | Yamanaka et al. |
| 7,622,367 B1 | 11/2009 | Nuzzo et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,893,612 B2 | 2/2011 | Cok |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,519,543 B1 | 8/2013 | Song et al. |
| 8,531,642 B2 | 9/2013 | Kiryuschev et al. |
| 8,558,243 B2 | 10/2013 | Bibl et al. |
| 8,605,452 B2 | 12/2013 | Tang |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,835,940 B2 | 9/2014 | Hu et al. |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,902,152 B2 | 12/2014 | Bai et al. |
| 8,946,760 B2 | 2/2015 | Kim |
| 8,987,765 B2 | 3/2015 | Bibl et al. |
| 9,105,714 B2 | 8/2015 | Hu et al. |
| 9,105,813 B1 | 8/2015 | Chang |
| 9,142,468 B2 | 9/2015 | Bower et al. |
| 9,153,171 B2 | 10/2015 | Sakariya et al. |
| 9,161,448 B2 | 10/2015 | Menard et al. |
| 9,178,123 B2 | 11/2015 | Sakariya et al. |

(56) References Cited

U.S. PATENT DOCUMENTS

| | | |
|---|---|---|
| 9,202,996 B2 | 12/2015 | Orsley et al. |
| 9,217,541 B2 | 12/2015 | Bathurst et al. |
| 9,308,649 B2 | 4/2016 | Golda et al. |
| 9,355,854 B2 | 5/2016 | Meitl et al. |
| 9,358,775 B2 | 6/2016 | Bower et al. |
| 9,368,683 B1 * | 6/2016 | Meitl .................. H01L 29/7848 |
| 9,437,782 B2 | 9/2016 | Bower et al. |
| 9,444,015 B2 | 9/2016 | Bower et al. |
| 9,478,583 B2 | 10/2016 | Hu et al. |
| 9,484,504 B2 | 11/2016 | Bibl et al. |
| 9,496,155 B2 | 11/2016 | Menard et al. |
| 9,520,537 B2 | 12/2016 | Bower et al. |
| 9,537,069 B1 | 1/2017 | Bower et al. |
| 9,555,644 B2 | 1/2017 | Rogers et al. |
| 9,601,356 B2 | 3/2017 | Bower et al. |
| 9,626,908 B2 | 4/2017 | Sakariya et al. |
| 9,640,715 B2 | 5/2017 | Bower et al. |
| 9,741,785 B2 | 8/2017 | Bower et al. |
| 9,761,754 B2 | 9/2017 | Bower et al. |
| 9,899,329 B2 | 2/2018 | Bower |
| 9,899,465 B2 | 2/2018 | Bower et al. |
| 2001/0022564 A1 | 9/2001 | Youngquist et al. |
| 2002/0096994 A1 | 7/2002 | Iwafuchi et al. |
| 2003/0211649 A1 | 11/2003 | Hirai et al. |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116324 A1 | 6/2005 | Yamaguchi |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0055864 A1 | 3/2006 | Matsumura et al. |
| 2006/0063309 A1 | 3/2006 | Sugiyama et al. |
| 2006/0116046 A1 | 6/2006 | Morley et al. |
| 2007/0035340 A1 | 2/2007 | Kimura |
| 2007/0077349 A1 | 4/2007 | Newman et al. |
| 2007/0201056 A1 | 8/2007 | Cok et al. |
| 2007/0235849 A1 | 10/2007 | Othieno et al. |
| 2008/0006843 A1 | 1/2008 | Dai et al. |
| 2008/0211734 A1 | 9/2008 | Huitema et al. |
| 2008/0224153 A1 | 9/2008 | Tomoda |
| 2009/0023243 A1 | 1/2009 | Koyanagi |
| 2009/0053498 A1 | 2/2009 | Matsuura et al. |
| 2009/0278141 A1 | 11/2009 | Coe-Sullivan et al. |
| 2009/0278142 A1 | 11/2009 | Watanabe et al. |
| 2009/0315054 A1 | 12/2009 | Kim et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0148198 A1 | 6/2010 | Sugizaki et al. |
| 2010/0186883 A1 | 7/2010 | Tomoda |
| 2010/0190293 A1 | 7/2010 | Maeda et al. |
| 2010/0207852 A1 | 8/2010 | Cok |
| 2010/0214247 A1 | 8/2010 | Tang et al. |
| 2010/0258710 A1 | 10/2010 | Wiese et al. |
| 2010/0264816 A1 | 10/2010 | Cok |
| 2010/0289115 A1 | 11/2010 | Akiyama et al. |
| 2010/0315319 A1 | 12/2010 | Cok et al. |
| 2010/0317132 A1 | 12/2010 | Rogers et al. |
| 2011/0043435 A1 | 2/2011 | Hebenstreit et al. |
| 2011/0067911 A1 | 3/2011 | Ishikawa et al. |
| 2011/0108800 A1 | 5/2011 | Pan |
| 2011/0133324 A1 | 6/2011 | Fan et al. |
| 2011/0147715 A1 | 6/2011 | Rogers et al. |
| 2011/0211348 A1 | 9/2011 | Kim |
| 2011/0244225 A1 | 10/2011 | Hattori et al. |
| 2012/0009738 A1 | 1/2012 | Crawford et al. |
| 2012/0080692 A1 | 4/2012 | Ohtorii |
| 2012/0119249 A1 | 5/2012 | Kim et al. |
| 2012/0141799 A1 | 6/2012 | Kub et al. |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0256163 A1 | 10/2012 | Yoon et al. |
| 2012/0314388 A1 | 12/2012 | Bower et al. |
| 2012/0319563 A1 | 12/2012 | Ishihara et al. |
| 2013/0015483 A1 | 1/2013 | Shimokawa et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0249138 A1 | 9/2013 | DeSimone et al. |
| 2013/0273695 A1 | 10/2013 | Menard et al. |
| 2013/0309792 A1 | 11/2013 | Tischler et al. |
| 2013/0328190 A1 | 12/2013 | Wu et al. |
| 2013/0333094 A1 | 12/2013 | Rogers et al. |
| 2014/0084482 A1 | 3/2014 | Hu et al. |
| 2014/0104243 A1 | 4/2014 | Sakariya et al. |
| 2014/0138543 A1 | 5/2014 | LaVeigne |
| 2014/0146273 A1 | 5/2014 | Kim et al. |
| 2014/0159043 A1 | 6/2014 | Sakariya et al. |
| 2014/0159065 A1 | 6/2014 | Hu et al. |
| 2014/0175498 A1 | 6/2014 | Lai |
| 2014/0183446 A1 | 7/2014 | Nago et al. |
| 2014/0217448 A1 | 8/2014 | Kim et al. |
| 2014/0231839 A1 | 8/2014 | Jeon et al. |
| 2014/0231851 A1 | 8/2014 | Tsai et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0319486 A1 | 10/2014 | Hong |
| 2014/0367633 A1 | 12/2014 | Bibl et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0263066 A1 | 9/2015 | Hu et al. |
| 2015/0280066 A1 | 10/2015 | Fujimura et al. |
| 2015/0280089 A1 | 10/2015 | Obata et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372187 A1 * | 12/2015 | Bower .................. H01L 33/007 438/110 |
| 2015/0372393 A1 | 12/2015 | Bower et al. |
| 2016/0005721 A1 | 1/2016 | Bower et al. |
| 2016/0018094 A1 | 1/2016 | Bower et al. |
| 2016/0064363 A1 | 3/2016 | Bower et al. |
| 2016/0066789 A1 | 3/2016 | Rogers et al. |
| 2016/0086855 A1 * | 3/2016 | Bower .................. B81C 99/008 438/110 |
| 2016/0093600 A1 | 3/2016 | Bower et al. |
| 2016/0308103 A1 * | 10/2016 | Hu .......................... H01L 33/08 |
| 2017/0025593 A1 | 1/2017 | Bower et al. |
| 2017/0187976 A1 | 6/2017 | Cok |
| 2017/0206845 A1 | 7/2017 | Sakariya et al. |
| 2017/0210117 A1 | 7/2017 | Rogers et al. |
| 2017/0213803 A1 | 7/2017 | Bower |
| 2017/0250167 A1 | 8/2017 | Bower et al. |
| 2017/0256521 A1 | 9/2017 | Cok et al. |
| 2017/0309698 A1 | 10/2017 | Bower et al. |
| 2017/0338374 A1 | 11/2017 | Zou et al. |
| 2018/0130751 A1 | 5/2018 | Bower |
| 2018/0138071 A1 | 5/2018 | Bower et al. |
| 2018/0151664 A1 | 5/2018 | Bower et al. |
| 2018/0277504 A1 | 9/2018 | Bower |
| 2018/0286734 A1 | 10/2018 | Meitl et al. |
| 2018/0323178 A1 | 11/2018 | Meitl et al. |
| 2019/0088526 A1 | 3/2019 | Bower et al. |

FOREIGN PATENT DOCUMENTS

| | | |
|---|---|---|
| JP | H11-142878 A | 5/1999 |
| JP | 2011066130 A | 3/2011 |
| WO | WO-2006/027730 A1 | 3/2006 |

(56) References Cited

FOREIGN PATENT DOCUMENTS

| WO | WO-2006/099741 A1 | 9/2006 |
| --- | --- | --- |
| WO | WO-2008/103931 A2 | 8/2008 |
| WO | WO-2010/032603 A1 | 3/2010 |
| WO | WO-2010/102310 A2 | 9/2010 |
| WO | WO-2010/111601 A2 | 9/2010 |
| WO | WO-2010/132552 A1 | 11/2010 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2016/046283 A2 | 3/2016 |
| WO | WO-2017/144573 A1 | 8/2017 |
| WO | WO-2018/091459 A1 | 5/2018 |

OTHER PUBLICATIONS

Choi, H. W. et al., Efficient GaN-based Micro-LED Arrays, Mat. Res. Soc. Symp. Proc. 743:L6.28.1-L6.28.6 (2003).

Elenius, Peter, Flip-Chip and Wire-Bond Interconnection Technologies, Chip Scale Review, Jul./Aug.:81-87 (2000).

Hamer et al., 63.2: AMOLED Displays Using Transfer-Printed Integrated Circuits, SID 09 Digest, 40(2):947-950 (2009).

International Search Report, PCT/EP2017/079195 (Micro-Transfer-Printable Flip-Chip Structures and Methods, filed Nov. 14, 2017), issued by ISA/EPO, 5 pages, dated Mar. 13, 2018.

Lee, M. S. et al., Optimization of copper pillar bump design for fine pitch flip-chip packages, Microsystems, Packaging, Assembly and Circuits Technology Conference 2009, Impact 2009, 4th International, pp. 128-131.

Lee, S. H. etal, Laser Lift-Off of GaN Thin Film and its Application to the Flexible Light Emitting Diodes, Proc. of SPIE 8460:846011-1-846011-6 (2012).

Lu, N. et al., Bio-Integrated Electronics, IEEE International Conference on IC Design & Technology, DOI: 10.1109/ICICDT.2014.6838615, IEEE May 28, 2014, [retrieved on Jun. 17, 2014] pp. 1-5 (2014).

Ohno, Y. and Ohzeki, Y., Development of Ultrathin Bonding Wire for Fine Pitch Bonding, Nippon Steel Technical Report 59:1-5 (1993).

Poher, V. et al., Micro-LED arrays: a tool for two-dimensional neuron stimulation, J. Phys. D: Appl. Phys. 41:094014 (2008).

Roscher, H., VCSEL Arrays with Redundant Pixel Designs for 10Gbits/s 2-D Space-Parallel MMF Transmission, Annual Report, optoelectronics Department, (2005).

Written Opinion, PCT/EP2017/079195 (Micro-Transfer-Printable Flip-Chip Structures and Methods, filed Nov. 14, 2017), issued by ISA/EPO, 10 pages, dated Mar. 13, 2018.

Yaniv et al., A 640×480 Pixel Computer Display Using Pin Diodes with Device Redundancy, 1988 International Display Research Conference, IEEE, CH-2678-1/88:152-154 (1988).

Bower, C. A. et al., Micro-Transfer-Printing: Heterogeneous Integration of Microscale Semiconductor Devices using Elastomer Stamps, 2014 IEEE Sensors, 3 pages and 1 page IEEE Xplore abstract, date of conference: Nov. 2-5, 2014.

Bower, C. A. et al., Transfer Printing: An Approach for Massively Parallel Assembly of Microscale Devices, IEEE, Electronic Components and Technology Conference, 2008, pp. 1105-1109.

Cok, R. S. et al., 60.3: AMOLED Displays Using Transfer-Printed Integrated Circuits, Society for Information Display, 10:902-904, (2010).

Cok, R. S. et al., AMOLED displays with transfer-printed integrated circuits, Journal of the SID, 19(4):335-341, (2011).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructural elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

\* cited by examiner

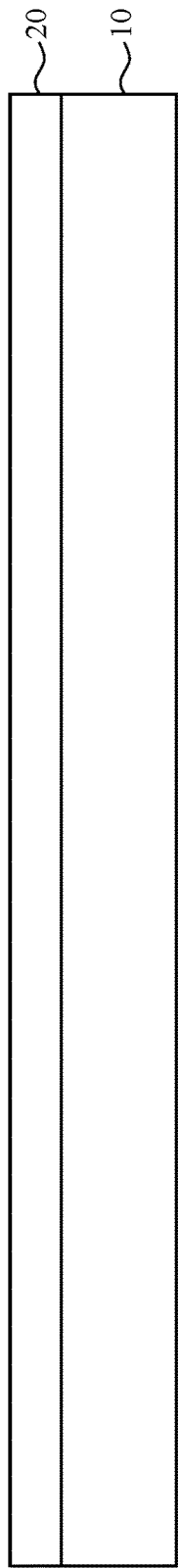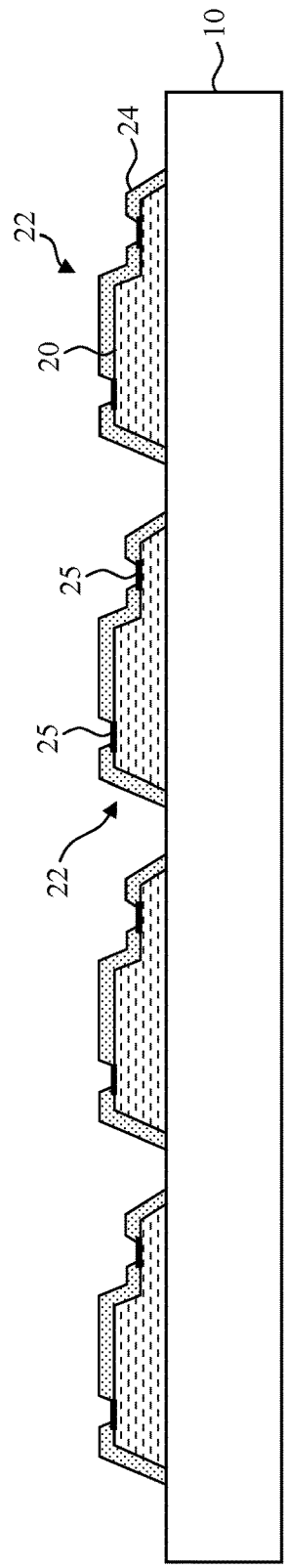

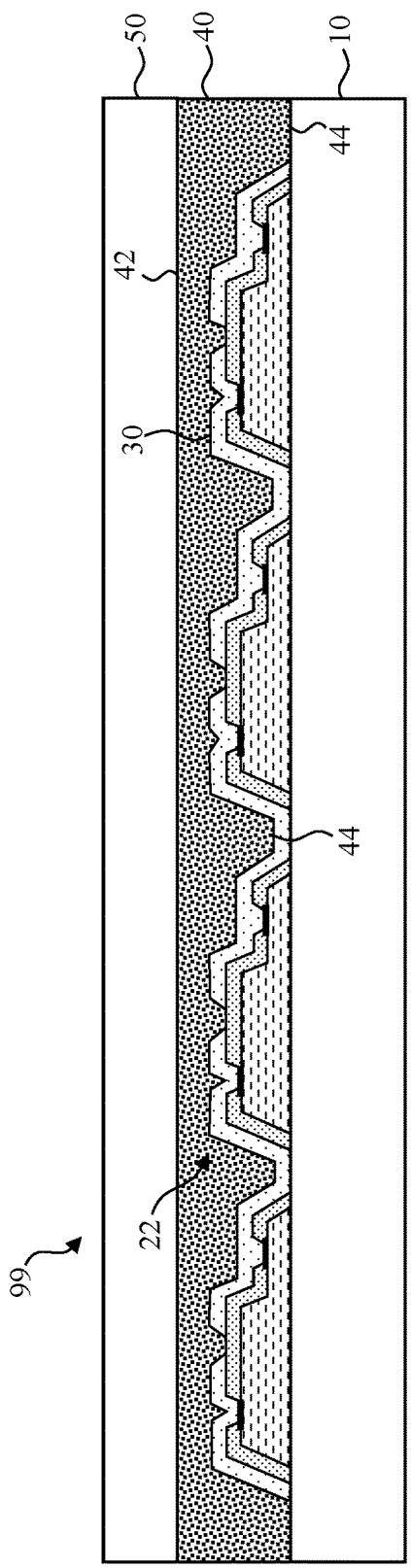
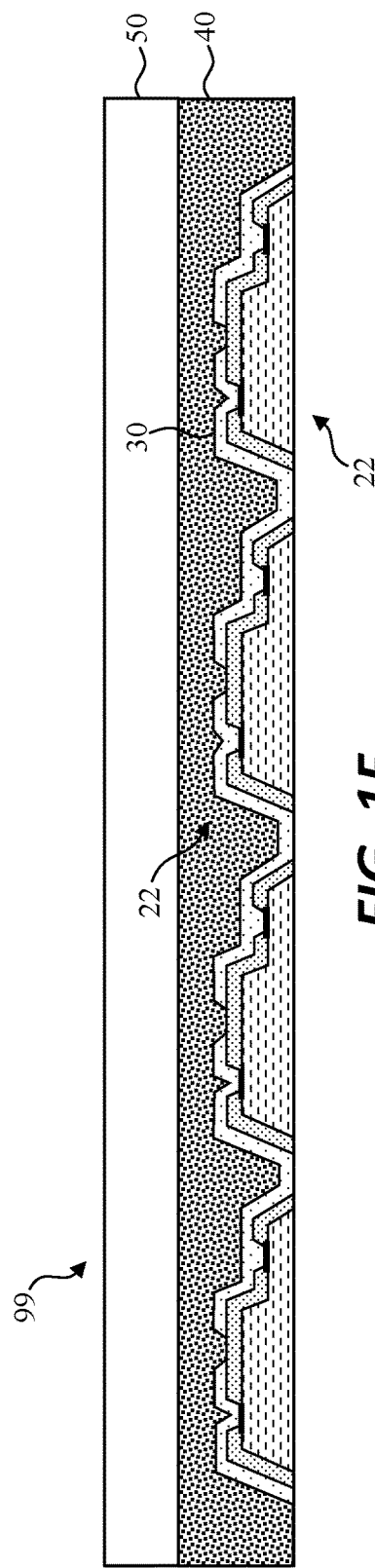
FIG. 1E
FIG. 1F

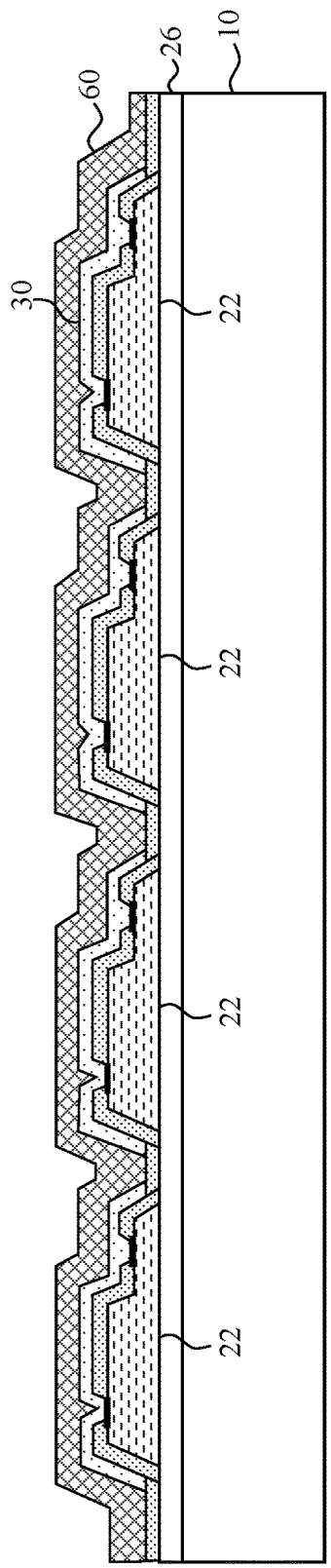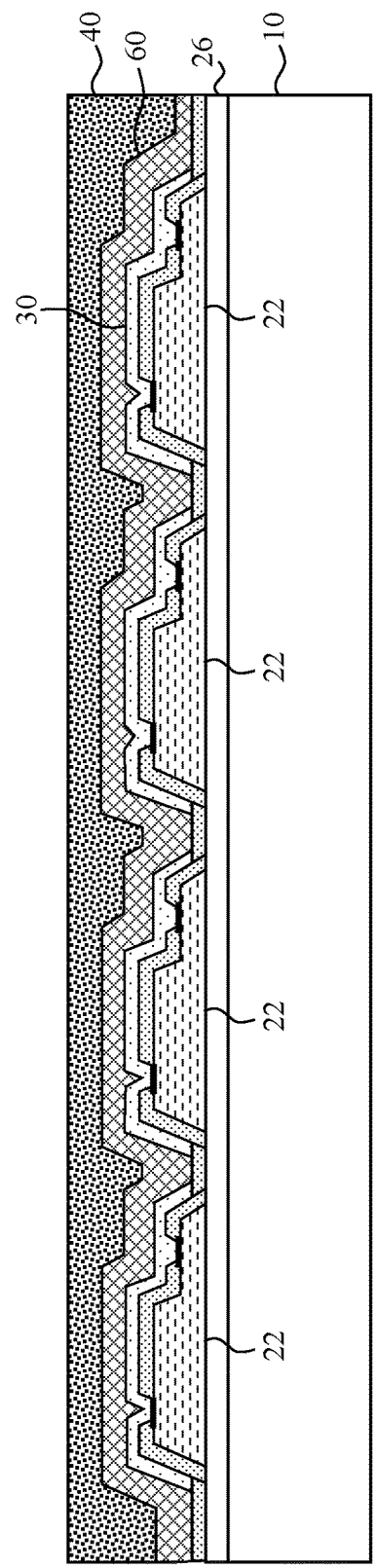
FIG. 2C
FIG. 2D

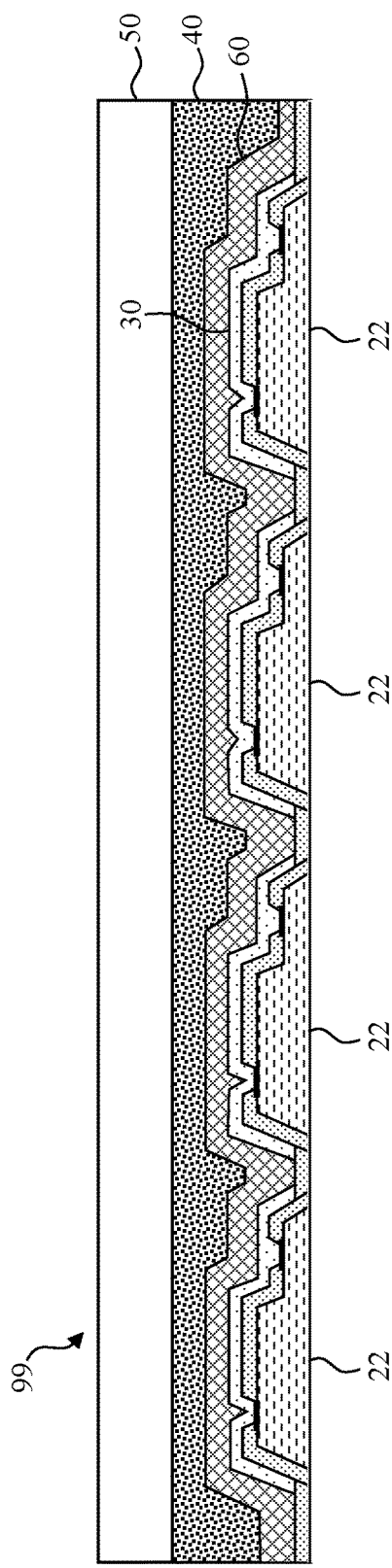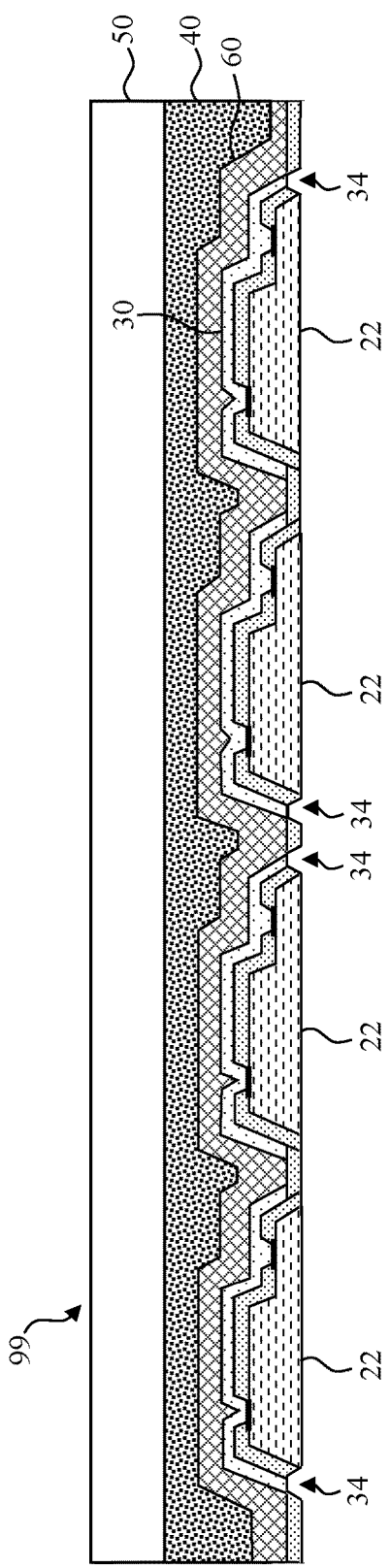

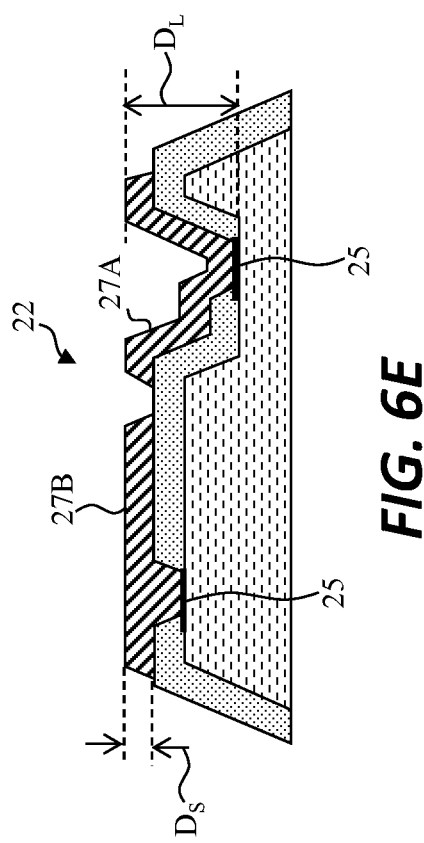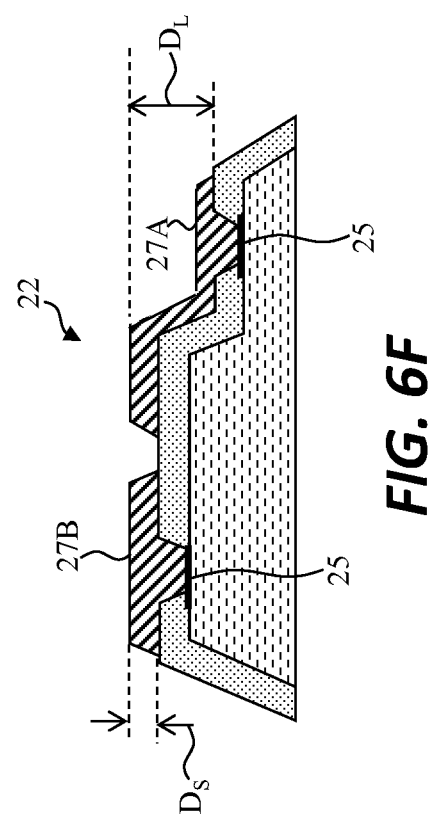

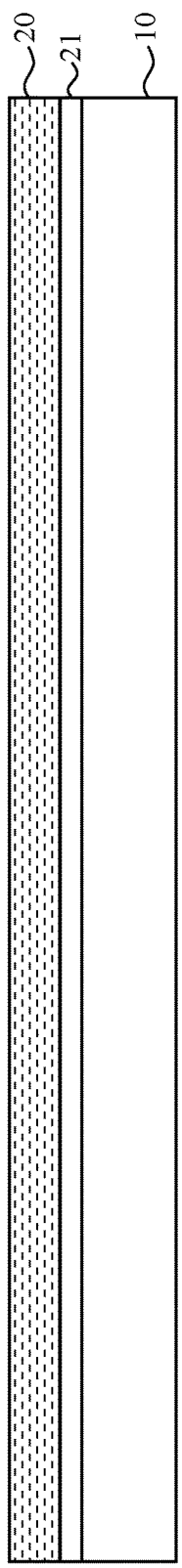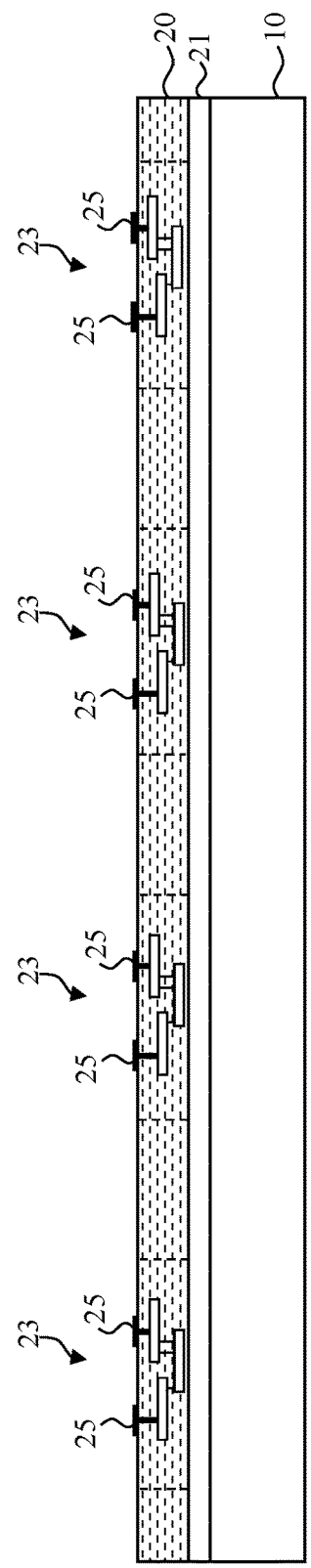

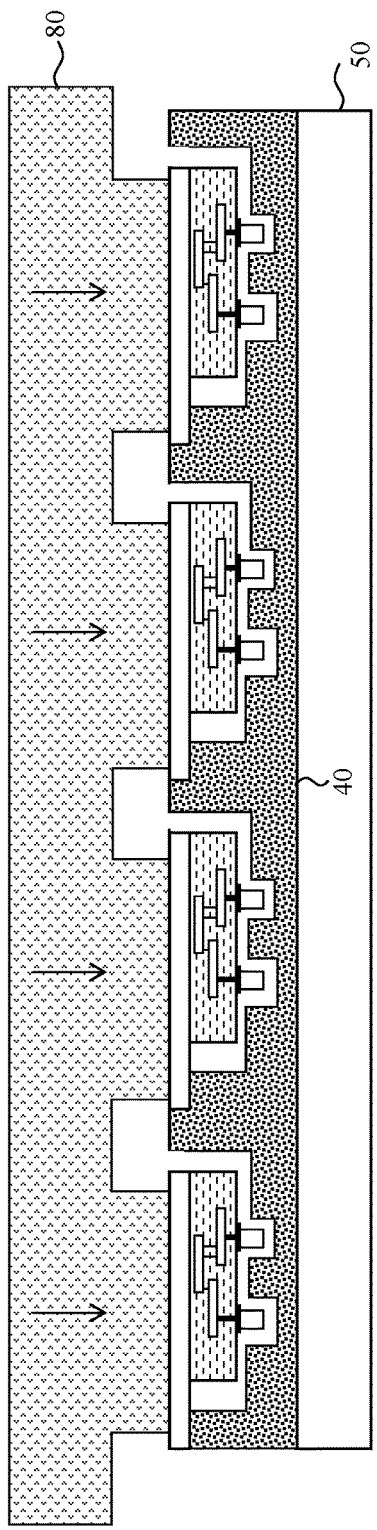
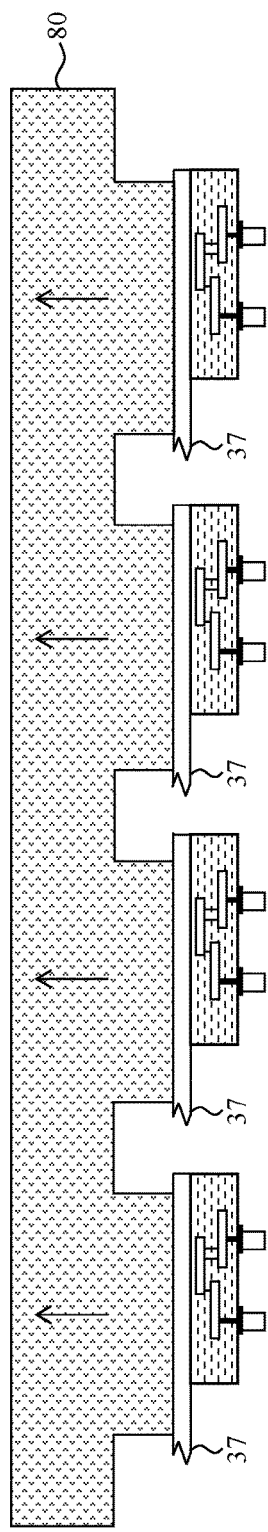
FIG. 10K
FIG. 10L

MICRO-TRANSFER-PRINTABLE FLIP-CHIP STRUCTURES AND METHODS

PRIORITY APPLICATIONS

This application is a continuation-in-part of U.S. patent application Ser. No. 15/811,959, filed Nov. 14, 2017, entitled "Micro-Transfer-Printable Flip-Chip Structures and Methods", which claims the benefit of U.S. Provisional Patent Application No. 62/422,365, filed Nov. 15, 2016, entitled "Micro-Transfer-Printable Flip-Chip Structure and Method", the disclosure of each of which is hereby incorporated by reference in its entirety.

CROSS REFERENCE TO RELATED APPLICATIONS

Reference is made to U.S. Pat. No. 9,368,683, issued Jun. 14, 2016, entitled "Printable Inorganic Semiconductor Method", the contents of which are incorporated by reference herein in their entirety.

FIELD OF THE INVENTION

The present invention relates to structures and methods for providing micro-integrated circuits on flip-chip substrates that can be printed using massively parallel micro-transfer printing methods.

BACKGROUND OF THE INVENTION

Integrated circuits (ICs) are widely used in electronic devices. Integrated circuits are typically formed on a semiconductor wafer using photolithographic processes and then packaged, for example in a ceramic or plastic package, with pins or bumps on the package providing externally accessible electrical connections to the integrated circuit. An unpackaged integrated circuit is often referred to as a die. Each die typically has electrical contact pads on the top of the integrated circuit that are electrically connected to electronic circuits in the integrated circuit. The die is placed in a cavity in the package, the electrical contact pads are wire-bonded to the package pins or bumps, and the package is sealed. Frequently, multiple identical devices are formed in the semiconductor wafer and the wafer is cut (for example by scribing-and-breaking or by sawing the wafer) into separate integrated circuit dies that are each individually packaged. The packages are then mounted and electrically connected on a printed circuit board to make an electronic system.

In an alternative flip-chip approach, small spheres of solder (solder bumps) are deposited on the integrated circuit contact pads and the integrated circuit is flipped over so that the top side of the die with the solder bumps is located adjacent to the package or other destination substrate. This approach is particularly useful for packages such as pin-grid array packages because they can require less space than a wire-bond process. However, flipping the integrated circuit over can be difficult for very small integrated circuits, for example having a dimension of less than 200, less than 50 microns, less than 20 microns, less than 10 microns, or less than 5 microns. Such small integrated circuit dies are not easily handled without loss or damage using conventional pick-and-place or vacuum tools.

In some applications, the bare integrated circuit dies are not separately packaged but are placed on a destination substrate and electrically connected on the destination substrate, for example using photolithographic or printed-circuit board methods, to form an electronic system. However, as with flip-chip handling, this can be difficult to accomplish when the integrated circuit dies are small. However, an efficient method of transferring bare dies from a relatively small and expensive source substrate (e.g., crystalline semiconductor) to a relatively large and inexpensive destination substrate (e.g., amorphous glass or plastic) is very desirable, since the integrated circuits can provide much higher data processing efficiency than thin-film semiconductor structures formed on large substrates.

In another method, a handle substrate is adhered to the side of the integrated circuits opposite the wafer (the top side), the wafer is removed, for example by grinding, the integrated circuits are adhered to the destination substrate, and the handle substrate is removed. In yet another variation, the handle substrate is the destination substrate and is not removed. In this case, the integrated circuit is flipped over so that the top side of the integrated circuit is adhered to the destination substrate.

In yet another method, epitaxial semiconductor layers are formed on a growth substrate, for example a sapphire substrate. A handle substrate is adhered to the top side of the semiconductor layers opposite the growth substrate, and the growth substrate is removed. The flipped semiconductor layers are then processed to form the integrated circuits. For example, U.S. Pat. No. 6,825,559 describes such a method to make light emitting diodes.

One approach to handling and placing small integrated circuits (e.g., chiplets) uses micro-transfer printing, for example as described in U.S. Pat. Nos. 8,722,458, 7,622,367 and 8,506,867, each of which is hereby incorporated by reference in its entirety. In exemplary embodiments of these methods for printing integrated circuits, an integrated circuit is disposed (e.g., formed) on a source wafer, for example a semiconductor wafer, and undercut by etching a gap between a bottom side of the integrated circuit and the wafer. A stamp contacts a top side of the integrated circuit to adhere the integrated circuit to the stamp, the stamp and integrated circuit are transported to a destination substrate, for example a glass or plastic substrate, the integrated circuit is contacted and adhered to the destination substrate, and the stamp removed to "print" the integrated circuit from the source wafer to the destination substrate. Multiple integrated circuits can be "printed" in a common step with a single stamp. The integrated circuits can then be electrically connected, for example, using conventional photolithographic and printed-circuit board methods. These techniques have the advantage of enabling location of many (e.g., tens of thousands to millions) small integrated circuit devices on a destination substrate in a single print step. For example, U.S. Pat. No. 8,722,458 teaches, inter alia, transferring light-emitting, light-sensing, or light-collecting semiconductor elements from a wafer substrate to a destination substrate using a patterned elastomer stamp whose spatial pattern matches the location of the semiconductor elements on the wafer substrate.

None of the aforementioned flip-chip methods form a flipped integrated circuit that can be micro-transfer printed. Moreover, GaN micro-LEDs are typically formed on sapphire substrates since sapphire has a smaller crystal lattice mismatch with GaN than other materials, such as silicon. Thus, it is desirable to form printable integrated circuit structures, such as micro-LEDs, using a sapphire substrate. However, there is no available method for undercutting a chiplet formed on a sapphire substrate to enable release of the chiplet for micro-transfer printing.

There is a need, therefore, for wafer and integrated circuit structures and methods that provide flipped micro-transfer printable integrated circuits and for structures and methods that enable the construction of micro-LED chiplets formed on a sapphire substrate that can be micro-transfer printed. There is also a need for simple and inexpensive methods and structures having a reduced area that enable electrical interconnections for chiplets printed on destination substrates. Furthermore, there is a need for methods and structures that enable electrically connecting the electrical contacts of printed structures, such as printed LEDs, using fewer processing steps than conventional methods.

SUMMARY OF THE INVENTION

In certain embodiments, a method of making a semiconductor structure suitable for micro-transfer printing comprises: providing a support substrate; disposing one or more semiconductor layers in, on, or over the support substrate, and optionally processing the semiconductor layers, to make a completed semiconductor device; forming a patterned release layer on or over the completed semiconductor device and optionally at least partly in contact with the support substrate; optionally providing a capping layer on the patterned release layer; providing a handle substrate; disposing a conformable and curable bonding layer on the patterned release layer, on the optional capping layer, or on the handle substrate; locating the handle substrate in contact with the bonding layer and curing the bonding layer to bond the handle substrate to the patterned release layer or to the capping layer; removing the support substrate to expose the completed semiconductor device and optionally expose a portion of the patterned release layer; and if at least a portion of the patterned release layer is not exposed, forming an entry path to expose a portion of the patterned release layer. In certain embodiments, a method comprises removing at least a portion of a patterned release layer to form a gap or space between at least a portion of a completed semiconductor device and at least a portion of a bonding layer and to form a tether physically connecting the completed semiconductor device to an anchor disposed on the handle substrate (e.g., wherein the anchor is a portion of the handle substrate or a layer disposed on the handle substrate, such as, for example, a bonding layer, a capping layer, or a dielectric layer). A tether can be disposed in a common plane with an entry path and can be fractured when a completed semiconductor device is micro-transfer printed or the tether can be disposed between the completed semiconductor device and the handle substrate, for example as a post with a physical interface to the completed semiconductor device.

A semiconductor structure can include a plurality of completed semiconductor devices and each of the plurality of completed semiconductor devices can have an individual tether and an individual anchor physically connecting the completed semiconductor devices to other structures or layers in the semiconductor structure, such as a bonding or capping layer(s). In some embodiments, at least two of a plurality of completed semiconductor devices have a common structure providing tethers for each completed semiconductor device or a common anchor structure to which the tethers are physically connected. At least two of a plurality of completed semiconductor devices can have a common anchor structure that is a ridge of material that contacts two or more completed semiconductor devices.

A removal layer such as an ablation or etch-stop layer can be provided between semiconductor layer(s) and a support substrate. In some embodiments, a destination substrate is provided and a completed semiconductor device is micro-transfer printed from a handle substrate to the destination substrate.

In some embodiments, a support substrate is removed by one or more of laser liftoff, ablation, laser ablation, etching, and grinding. A support substrate can be transparent to electromagnetic radiation and removing the support substrate can expose a semiconductor layer to electromagnetic radiation through the support substrate to decompose a portion of the semiconductor layer(s) or completed semiconductor device and form a shock wave in the semiconductor structure. Alternatively, an ablation layer is provided between a support substrate and semiconductor layer(s) and the support substrate is removed by exposing the ablation layer to electromagnetic radiation through the support substrate to decompose a portion of the ablation layer and form a shock wave in a completed semiconductor structure. A capping layer can have a thickness, layers, structure, and material sufficient to disperse, deflect, reflect, or absorb a shock wave produced by laser ablation of at least a portion of a ablation layer, a portion of a semiconductor layer, or a portion of a completed semiconductor device.

In some embodiments, a support substrate is a semiconductor substrate and disposing one or more semiconductor layers in, on, or over the support substrate includes doping (e.g., implanting) a portion or layer of the semiconductor substrate. Alternatively, or in addition, disposing one or more semiconductor layers in, on, or over a support substrate can include growing the one or more semiconductor layers on the support substrate or growing the one or more semiconductor layers on a growth layer or semiconductor seed layer on the support substrate.

A semiconductor structure suitable for micro-transfer printing can include: a handle substrate; a conformable, cured bonding layer disposed in contact with the handle substrate; an optional capping layer disposed in contact with the bonding layer; a patterned release layer disposed in contact with the cured bonding layer or the capping layer, wherein the patterned release layer has an entry path; and a completed semiconductor device disposed on or over the patterned release layer and attached to an anchor disposed on the handle substrate with at least one tether.

A support substrate can be one or more of sapphire, quartz, silicon, GaAs, GaN, InP, SiC, GaP, GaSb, AN, and MgO. A completed semiconductor device can include one or more of a semiconductor material, a compound semiconductor material, GaN, Si, InP, SiGe, and GaAs. A patterned release layer includes one or more of germanium, Si, TiW, Al, Ti, a lift-off resist, and a polymer. A support substrate can be a growth substrate, have a semiconductor seed layer, or have a semiconductor layer. A cured bonding layer can be a cured resin, SU-8, epoxy, a metal layer, a metal alloy layer, a solder layer, or a layer of AuSn.

In some embodiments, a completed semiconductor device is exposed and/or an entry path is exposed. In some embodiments, a removal layer is only a portion of the completed semiconductor device. In some embodiments, a removal layer is in contact with a completed semiconductor device and is disposed on or over, or is a part of, a support substrate. A support substrate can be in contact with a removal layer or with a completed semiconductor device. A capping layer can include a plurality of layers.

In some embodiments, a completed semiconductor device includes a semiconductor structure with at least two electrical contacts to the completed semiconductor device that are in different planes. A completed semiconductor device can include an electrically separate electrode electrically connected to each of the electrical contacts and exposed portions of the electrodes are in a common plane. Exposed portions of the electrodes are used to make electrical contact to external electrical conductors.

A destination substrate onto which the completed semiconductor device is micro-transfer printed can have a non-planar surface with a topography that corresponds to a non-planar semiconductor structure surface to facilitate electrical connections between the completed semiconductor device and electrical contact pads on the destination substrate.

In some embodiments, an electrical contact is disposed on the side of a completed semiconductor device adjacent to a support substrate or on the side of the completed semiconductor device adjacent to a patterned release layer. Each electrical contact can include or be connected to a connection post. In some embodiments, an electrode is electrically connected to each electrical contact and a connection post is electrically connected to each electrode or the electrode includes or forms a connection post. A connection post can have a first surface adjacent to a surface of the completed semiconductor device and a second opposing surface farther away from the completed semiconductor device than the first surface. The second opposing surface can have a smaller area than the first surface. Furthermore, a connection post can have a height that is greater than a dimension of the first surface, the connection post can have a height that is greater than a dimension of the second opposing surface, or the connection post can have a height that is greater than a width of the connection post.

In one aspect, the present invention is directed to a method of making a semiconductor structure suitable for transfer printing (e.g., micro-transfer printing), comprising: providing a support substrate; forming a completed semiconductor device disposed in, on, or over the support substrate; forming a patterned release layer on or over the completed semiconductor device; providing a capping layer on the patterned release layer; providing a handle substrate; disposing a conformable and curable bonding layer on the capping layer or on the handle substrate; disposing the handle substrate and the capping layer in contact with the bonding layer; curing the bonding layer to bond the handle substrate to the capping layer; and removing the support substrate to expose the completed semiconductor device (e.g., thereby exposing the completed semiconductor device).

In certain embodiments, the method comprises forming an entry path to expose a portion of the patterned release layer. In certain embodiments, the method comprises removing at least a portion of the patterned release layer to form a gap between at least a portion of the completed semiconductor device and at least a portion of the bonding layer; and forming a tether physically connecting the completed semiconductor device to an anchor disposed on the handle substrate (e.g., wherein the anchor is a portion of the handle substrate or a layer disposed on the handle substrate, such as, for example, the bonding layer, the capping layer, or a dielectric layer). In certain embodiments, the method comprises: providing a destination substrate; and micro-transfer printing the completed semiconductor device from the handle substrate to the destination substrate.

In certain embodiments, the support substrate is transparent to electromagnetic radiation and the method comprises: exposing the semiconductor layer to electromagnetic radiation through the support substrate to decompose a portion of the completed semiconductor device and form a shock wave in the semiconductor structure, wherein the capping layer disperses, reflects, deflects, or absorbs the shock wave. In certain embodiments, the support substrate is transparent to electromagnetic energy, and the method comprises: providing an ablation layer between the support substrate and the completed semiconductor device; and exposing the ablation layer to electromagnetic radiation through the support substrate to decompose a portion of the ablation layer and form a shock wave in the completed semiconductor structure, wherein the capping layer disperses, reflects, deflects, or absorbs the shock wave.

In certain embodiments, removing the support substrate comprises one or more of laser liftoff, ablation, laser ablation, etching, and grinding. In certain embodiments, the method comprises providing an ablation or etch-stop layer between the completed semiconductor device and the support substrate. In certain embodiments, removing the support substrate to expose the completed semiconductor device comprises removing a removal layer (e.g., an ablation layer or an etch-stop layer) (e.g., thereby exposing the completed semiconductor layer).

In certain embodiments, the support substrate is a semiconductor substrate and forming the completed semiconductor device comprises: doping a portion or layer of the semiconductor substrate. In certain embodiments, forming the completed semiconductor device comprises: disposing one or more semiconductor layers in, on, or over the support substrate. In certain embodiments, forming the completed semiconductor device comprises growing the one or more semiconductor layers on the support substrate or on a growth layer on the support substrate. In certain embodiments, forming the completed semiconductor device comprises: processing the one or more semiconductor layers.

In another aspect, the present invention is directed to a method of making a semiconductor structure suitable for transfer printing (e.g., micro-transfer printing), comprising: providing a support substrate; forming a completed semiconductor device disposed in, on, or over the support substrate; forming a patterned release layer on or over the completed semiconductor device; providing a handle substrate; disposing a conformable and curable bonding layer on the patterned release layer or on the handle substrate; disposing the handle substrate and the patterned release layer in contact with the bonding layer; curing the bonding layer to bond the handle substrate to the patterned release layer; and removing the support substrate to expose the completed semiconductor device (e.g., thereby exposing the completed semiconductor device).

In certain embodiments, the method comprises disposing the conformable and curable bonding layer on the patterned release layer, wherein disposing the conformable and curable bonding layer on the patterned release layer comprises disposing the conformable and curable bonding layer on at least one of (i) a portion of a dielectric layer disposed on the completed semiconductor structure and (ii) a portion of the completed semiconductor structure.

In certain embodiments, the method comprises removing at least a portion of the patterned release layer to form a gap between at least a portion of the completed semiconductor device and at least a portion of the bonding layer; and forming a tether physically connecting the completed semiconductor device to an anchor disposed on the handle substrate (e.g., wherein the anchor is a portion of the handle substrate or a layer disposed on the handle substrate, such as, for example, the bonding layer or a dielectric layer). In certain embodiments, the method comprises providing a destination substrate; and micro-transfer printing the completed semiconductor device from the handle substrate to the destination substrate.

In certain embodiments, removing the support substrate comprises one or more of laser liftoff, ablation, laser ablation, etching, and grinding. In certain embodiments, the method comprises providing an ablation or etch-stop layer between the completed semiconductor device and the support substrate. In certain embodiments, removing the support substrate to expose the completed semiconductor device comprises removing a removal layer (e.g., an ablation layer or an etch-stop layer) (e.g., thereby exposing the completed semiconductor device).

In certain embodiments, the support substrate is a semiconductor substrate and forming the completed semiconductor device comprises: doping a portion or layer of the semiconductor substrate. In certain embodiments, forming the completed semiconductor device comprises: disposing one or more semiconductor layers in, on, or over the support substrate. In certain embodiments, forming the completed semiconductor device comprises: growing the one or more semiconductor layers on the support substrate or on a growth layer on the support substrate. In certain embodiments, forming the completed semiconductor device comprises: processing the one or more semiconductor layers.

In another aspect, the present invention is directed to a semiconductor structure suitable for transfer printing (e.g., micro-transfer printing), comprising: a handle substrate; a cured bonding layer disposed in contact with the handle substrate; a patterned release layer disposed in contact with the cured bonding layer; and a completed semiconductor device disposed on or over the patterned release layer and attached to an anchor disposed on the handle (e.g., wherein the anchor is a portion of the handle substrate or a layer disposed on the handle substrate, such as, for example, the bonding layer or a dielectric layer) substrate with at least one tether.

In certain embodiments, at least one of the completed semiconductor device and a portion of the patterned release layer is exposed.

In certain embodiments, a portion of the completed semiconductor device is a removal layer or the semiconductor structure comprises a removal layer in contact with the completed semiconductor device.

In certain embodiments, the semiconductor structure comprises a support substrate in contact with the removal layer. In certain embodiments, the semiconductor structure comprises a support substrate in contact with the completed semiconductor device.

In certain embodiments, the completed semiconductor device comprises a semiconductor structure comprising at least two electrical contacts to the completed semiconductor device that are in different planes. In certain embodiments, the completed semiconductor device comprises an electrically separate electrode electrically connected to each of the electrical contacts, wherein exposed portions of the electrodes are in a common plane. In certain embodiments, the semiconductor structure comprises a destination substrate having a non-planar surface that corresponds to a non-planar surface of the completed semiconductor structure.

In certain embodiments, the support substrate comprises one or more of sapphire, quartz, silicon, GaAs, GaN, InP, SiC, GaP, GaSb, AlN, and MgO. In certain embodiments, the completed semiconductor device comprises one or more of a semiconductor material, a compound semiconductor material, GaN, Si, InP, SiGe, and GaAs. In certain embodiments, the patterned release layer comprises one or more of germanium, Si, TiW, Al, Ti, a lift-off resist, and a polymer.

In certain embodiments, the semiconductor structure comprises one or more electrical contacts on a side of the completed semiconductor device adjacent to the patterned release layer or one or more electrical contacts on a side of the completed semiconductor device opposite the side of the completed semiconductor device adjacent to the patterned release layer (e.g., a side adjacent to a support substrate in the semiconductor structure).

In certain embodiments, (i) each electrical contact comprises a connection post or (ii) the semiconductor structure comprises an electrode electrically connected to each electrical contact and a connection post electrically connected to each electrode (e.g., wherein the electrode comprises or forms a connection post). In certain embodiments, each connection post is tapered (e.g., has a first surface adjacent to a surface of the completed semiconductor device and a second opposing surface and the second opposing surface has a smaller area than an area of the first surface). In certain embodiments, each connection post has a height to width aspect ratio of greater than 1:1.

In certain embodiments, the at least one tether is disposed between the completed semiconductor device and the handle substrate.

In certain embodiments, the semiconductor structure comprises a plurality of completed semiconductor devices, wherein each of the plurality of completed semiconductor devices comprises an individual tether connected to a unique anchor. In certain embodiments, the semiconductor structure comprises a plurality of completed semiconductor devices, wherein at least two of the plurality of completed semiconductor devices are physically connected by respective tethers to a common anchor structure. In certain embodiments, at least two of the plurality of completed semiconductor devices are connected to a common anchor structure that is a ridge of bonding layer material.

In certain embodiments, the support substrate is a growth substrate. In certain embodiments, the support substrate comprises a semiconductor layer or a semiconductor seed layer. In certain embodiments, the cured bonding layer comprises at least one of a cured resin, an epoxy, a metal layer, a metal alloy layer, a solder layer, and a layer of AuSn.

In certain embodiments, surfaces at opposing edges of the completed semiconductor device are in a common plane, wherein a first electrical contact is located at the bottom of a well, pit, or depression in the completed semiconductor device and is electrically connected to a first electrode, wherein a second electrical contact electrically separate from the first electrical contact is electrically connected to a second electrode, and wherein the first electrode has a greater height than the height of the second electrode so that exposed portions of the first and second electrodes are in a common plane.

In another aspect, the present invention is directed to a semiconductor structure suitable for transfer printing (e.g., micro-transfer printing), comprising: a handle substrate; a cured bonding layer disposed in contact with the handle substrate; a capping layer disposed in contact with the bonding layer; a patterned release layer disposed in contact with the capping layer; and a completed semiconductor device disposed on or over the patterned release layer and attached to an anchor disposed on the handle substrate with at least one tether (e.g., wherein the anchor is a portion of the handle substrate or a layer disposed on the handle substrate, such as, for example, the bonding layer, the capping layer, or a dielectric layer).

In certain embodiments, at least one of the completed semiconductor device and a portion of the patterned release layer is exposed. In certain embodiments, a portion of the completed semiconductor device is a removal layer or the semiconductor structure comprises a removal layer in contact with the completed semiconductor device. In certain embodiments, the semiconductor structure comprises a support substrate in contact with the removal layer. In certain embodiments, a support substrate in contact with the completed semiconductor device.

In certain embodiments, the capping layer has a thickness sufficient to disperse, deflect, reflect, or absorb a shock wave produced by laser ablation of at least a portion of the removal layer. In certain embodiments, the capping layer has a thickness sufficient to disperse, deflect, reflect or absorb a shock wave produced by laser ablation of a portion of the completed semiconductor device. In certain embodiments, the capping layer comprises a plurality of layers.

In certain embodiments, the completed semiconductor device comprises a semiconductor structure comprising at least two electrical contacts to the completed semiconductor device that are in different planes. In certain embodiments, the completed semiconductor device comprises an electrically separate electrode electrically connected to each of the electrical contacts, wherein exposed portions of the electrodes are in a common plane.

In certain embodiments, the semiconductor structure comprises a destination substrate having a non-planar surface that corresponds to a non-planar surface of the completed semiconductor structure.

In certain embodiments, the support substrate comprises one or more of sapphire, quartz, silicon, GaAs, GaN, InP, SiC, GaP, GaSb, AlN, and MgO. In certain embodiments, the completed semiconductor device comprises one or more of a semiconductor material, a compound semiconductor material, GaN, Si, InP, SiGe, and GaAs. In certain embodiments, the patterned release layer comprises one or more of germanium, Si, TiW, Al, Ti, a lift-off resist, or a polymer.

In certain embodiments, the semiconductor structure comprises one or more electrical contacts on a side of the completed semiconductor device adjacent to the patterned release layer or one or more electrical contacts on a side of the completed semiconductor device opposite the side of the completed semiconductor device adjacent to the patterned release layer (e.g., a side adjacent to a support substrate in the semiconductor structure).

In certain embodiments, each electrical contact comprises a connection post or (ii) the semiconductor structure comprises an electrode electrically connected to each electrical contact and a connection post electrically connected to each electrode (e.g., wherein the electrode comprises or forms a connection post). In certain embodiments, each connection post is tapered (e.g., has a first surface adjacent to a surface of the completed semiconductor device and a second opposing surface and the second opposing surface has a smaller area than an area of the first surface). In certain embodiments, each connection post has a height to width aspect ratio of greater than 1:1.

In certain embodiments, a surface of the at least one tether is disposed in a common plane a surface of the completed semiconductor device. In certain embodiments, the semiconductor structure comprises a plurality of completed semiconductor devices, wherein each of the plurality of completed semiconductor devices comprises an individual tether connected to a unique anchor. In certain embodiments, the semiconductor structure comprises a plurality of completed semiconductor devices, wherein at least two of the plurality of completed semiconductor devices are physically connected by respective tethers to a common anchor structure.

In some embodiments of the present invention, a method of making a semiconductor structure suitable for transfer printing comprises providing a support substrate, providing a semiconductor support layer over the support substrate, providing a semiconductor layer disposed over the semiconductor support layer, forming a plurality of semiconductor devices disposed in, on, or over the semiconductor support layer, each of the semiconductor devices comprising one or more electrical contacts exposed on a side of the semiconductor device opposite the semiconductor support layer, forming a connection post on each of the exposed electrical contacts, the connection posts extending in a direction away from the semiconductor support layer, patterning the semiconductor layer to separate the semiconductor devices in order to form a corresponding plurality of completed semiconductor devices, patterning the semiconductor support layer to expose a portion of the support substrate, forming a patterned release layer on or over the plurality of completed semiconductor devices, the patterned release layer (i) in contact with portions of the patterned semiconductor support layer on which the complete semiconductor devices are disposed and (ii) in contact with at least a portion of the support substrate, providing a handle substrate, disposing a conformable bonding layer on the patterned release layer or on the handle substrate, bonding the handle substrate to the patterned release layer with the bonding layer, and removing the support substrate to expose at least a portion of the patterned semiconductor support layer.

In some embodiments, methods of the present invention comprise disposing a capping layer over the patterned release layer, wherein the capping layer disperses, deflects, reflects, or absorbs a shock wave produced by laser ablation of at least a portion of the support substrate or semiconductor support layer.

In some embodiments, methods of the present invention comprise removing at least a portion of the patterned release layer to form a gap between at least a portion of the completed semiconductor device and at least a portion of the bonding layer, and forming tethers physically connecting the plurality of completed semiconductor devices to anchors disposed on the handle substrate.

In some embodiments of the present invention, the anchors are disposed laterally between ones of the plurality of completed semiconductor devices and each of the tethers extends laterally from one of the completed micro-device to one of the anchors. Each of the tethers can be a portion of the semiconductor support layer.

Methods of the present invention can comprise micro-transfer printing the completed semiconductor devices from the handle substrate to a destination substrate and electrically contacting the connection posts to corresponding electrical contact pads on the destination substrate. Removing the support substrate can comprise one or more of laser liftoff, ablation, laser ablation, etching, and grinding.

In some embodiments of the present invention, the semiconductor support layer is an ablation layer, a removal layer, or an etch-stop layer disposed between the completed semiconductor device and the support substrate. Removing the support substrate can comprise removing a removal layer.

In certain embodiments of the present invention, a semiconductor structure suitable for transfer printing comprises a handle substrate, a bonding layer disposed in contact with the handle substrate, a patterned release layer disposed in contact with the bonding layer, a plurality of completed semiconductor devices disposed on or over the patterned release layer and each attached to one or more anchors disposed on the handle substrate with at least one tether, each of the plurality of completed semiconductor devices comprising at least one electrical contact disposed on a side of the completed semiconductor device between the completed semiconductor device and the handle substrate, a connection post disposed on each of the at least one electrical contacts and extending from the electrical contact toward the handle substrate, and a patterned semiconductor support layer comprising a surface on which is disposed the plurality of completed semiconductor devices and wherein the surface is in contact with a portion of the patterned release layer.

In some embodiments, a portion of the patterned release layer is exposed. In some embodiments, a portion of the plurality of completed semiconductor devices or the semiconductor support layer is or comprises a removal layer.

In some embodiments of the present invention, a semiconductor structure comprises a support substrate in contact with the patterned semiconductor support layer and in contact with a portion of the patterned release layer. The support substrate can comprise a removal layer.

In certain embodiments, the patterned release layer defines a gap between the plurality of completed semiconductor devices and the bonding layer. In some embodiments of the present invention, a semiconductor structure suitable for transfer printing comprises a handle substrate, a bonding layer disposed in contact with the handle substrate, a capping layer disposed in contact with the bonding layer, a patterned release layer disposed in contact with capping layer, a plurality of completed semiconductor devices disposed on or over the patterned release layer and each attached to at least one anchor disposed on the handle substrate with at least one tether, each of the plurality of completed semiconductor devices comprising at least one electrical contact disposed on a side of the completed semiconductor device between the completed semiconductor device and the handle substrate, a connection post disposed on each of the at least one electrical contacts and extending from the electrical contact toward the handle substrate, and a patterned semiconductor support layer comprising a surface on which is disposed the completed semiconductor devices and wherein the surface is in contact with a portion of the patterned release layer.

In some embodiments of the present invention, a portion of the patterned release layer is exposed. In some embodiments of the present invention, the semiconductor structure comprises a support substrate in contact with the semiconductor support layer and in contact with a portion of the patterned release layer.

In some embodiments of the present invention, a portion of the plurality of completed semiconductor devices or the semiconductor support layer is a removal layer, or the semiconductor structure comprises a removal layer in contact with the completed semiconductor device. The support substrate can comprise a removal layer.

In certain embodiments, the support substrate is a growth substrate. In certain embodiments, the support substrate comprises a semiconductor layer or a semiconductor seed layer. In certain embodiments, the cured bonding layer comprises at least one of a cured resin, an epoxy, a metal layer, a metal alloy layer, a solder layer, and a layer of AuSn.

In certain embodiments, surfaces at opposing edges of the completed semiconductor device are in a common plane, wherein a first electrical contact is located at the bottom of a well, pit, or depression in the completed semiconductor device and is electrically connected to a first electrode, wherein a second electrical contact electrically separate from the first electrical contact is electrically connected to a second electrode, and wherein the first electrode has a greater height than the height of the second electrode so that exposed portions of the first and second electrodes are in a common plane.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 1A-1J are successive cross sections illustrating (i) sequential steps in an exemplary method and (ii) a semiconductor structure, according to illustrative embodiments of the present invention;

FIGS. 2A-2K are successive cross sections illustrating sequential steps in another exemplary method and (ii) another semiconductor structure, according to illustrative embodiments of the present invention;

FIGS. 6A-6F are cross sections illustrating a variety of completed semiconductor devices with a corresponding variety of connection post structures, according to illustrative embodiments of the present invention;

Figure 1C:
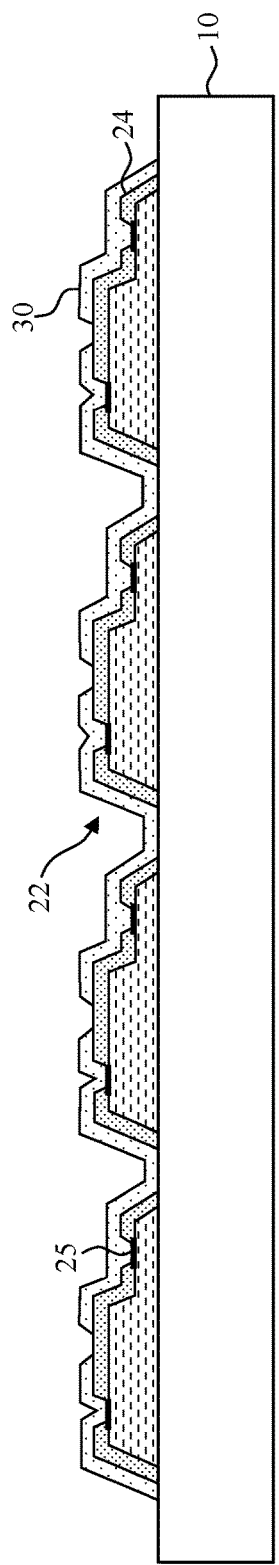

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides, inter alia, structures and methods to enable micro-transfer printing from devices formed on a sapphire substrate. The present invention also provides, inter alia, structures and methods to enable micro-transfer printing of flipped integrated circuits adhered to a handle substrate. By forming completed semiconductor devices before the removal of a support or growth substrate, photolithographic processing steps that would otherwise disable or destroy release layers and structures needed for transfer printing (e.g., micro-transfer printing) are performed before the construction of the release layer. Thus, once a support or growth substrate is removed, a release layer can be etched and completed semiconductor devices can be transfer printed (e.g., micro-transfer printed) without exposing the completed semiconductor device or release layer to destructive photolithographic process steps. Completed semiconductor devices are otherwise functional devices that do not necessarily include the electrical conductors necessary for providing electrical power to the completed semiconductor devices.

According to some embodiment of the present invention, and referring to FIGS. 1A-1J and FIG. 9, an exemplary method of making a semiconductor structure 99 (FIGS. 1E-1G) suitable for micro-transfer printing includes providing a support substrate 10 in step 100 and forming a completed semiconductor device 22 (i.e., in this exemplary method by disposing one or more semiconductor layers 20 in, on, or over the support substrate 10) in step 105 (as shown in FIG. 1A). A completed semiconductor device 22 can be formed by disposing one or more layers or substructures on a support substrate 10. The one or more semiconductor layers 20 can optionally be processed in step 110 to make completed semiconductor devices 22 (as shown in FIG. 1B). The processing can include, for example, patterning materials, adding other materials, and forming structures.

In some embodiments, a support substrate 10 comprises at least one of glass, plastic, semiconductor, compound semiconductor, sapphire (e.g., aluminum oxide or $Al_2O_3$), ceramic, quartz, silicon, GaAs, GaN, InP, SiC, GaP, GaSb, AlN, an MgO. A support substrate 10 can be a different other substrate suitable for photolithographic processing. A support substrate 10 can be substantially transparent, for example 50%, 70%, or 90% transparent to at least one of visible, UV, and IR electromagnetic radiation. A support substrate 10 can include multiple layers, can include one or more semiconductor layers 20, can be a growth substrate, or can include a growth or semiconductor seed layer on which the one or more semiconductor layers 20 are formed or disposed. A support substrate 10 can be crystalline or have a crystalline layer.

One or more semiconductor layers 20 can be organic or inorganic, can be crystalline, can be a semiconductor, can be a compound semiconductor, can be doped (e.g., implanted), for example with p or n doping to provide desired electrical structures and functions, or any combination thereof. A semiconductor layer in the one or more semiconductor layer 20 in a completed semiconductor device 22 can include one or more of GaN, Si, InP, SiGe, and GaAs. Each of the one or more semiconductor layers 20 can be formed or disposed in step 105 using photolithographic processes including, for example, evaporation or sputtering. In some embodiments, at least one of the one or more semiconductor layers 20 is formed or disposed using a chemical vapor deposition, molecular/atomic layer deposition, physical vapor deposition, pulsed laser deposition or epitaxy method. In some embodiments, a support substrate 10 is a semiconductor substrate and disposing one or more semiconductor layers 20 in, on, or over the support substrate 10 (step 105) includes doping (e.g., implanting) a portion or layer of a semiconductor substrate (e.g., support substrate 10) to form the one or more semiconductor layers 20. In some embodiments, disposing one or more semiconductor layers 20 in, on, or over a support substrate 10 (step 105) includes growing the one or more semiconductor layers 20 on the support substrate 10 or on a growth layer on the support substrate 10, for example using epitaxial techniques. In these embodiments, the support substrate 10 can be, but is not necessarily, a crystalline semiconductor substrate or sapphire substrate. In some embodiments, a support substrate 10 is a sapphire substrate. In some embodiments, a support substrate 10 is a crystalline semiconductor substrate.

The one or more semiconductor layers 20 can be optionally processed in step 110 using photolithographic methods, including, for example, evaporation, sputtering, CVD, annealing, or masking using photoresist, exposure to patterned radiation, and etching. One or more semiconductor layers 20 can be patterned and structured and additional layers and structures can be formed on or in the one or more semiconductor layers 20, for example, patterned dielectric layers 24 or patterned conductors such as electrical contacts 25 formed, as shown in FIG. 1B. Electrical contacts 25 can be a metalized portion of one or more of the semiconductor layers 20 or a patterned metal layer over one or more of the semiconductor layers 20 (e.g., with Ag, Al, Ni, Ti, Au, Pd, W, or metal alloys) or simply a designated portion of one or more of the semiconductor layers 20 (e.g., designated for forming electrical connections) and are, in any case, portions of the completed semiconductor device 22 to which electrical connections can be made and power and signals provided to operate the completed semiconductor device 22. In some embodiments, a completed semiconductor device 22 is formed of one or more semiconductor layers 20 and any additional layers and structures necessary to function as intended. In some embodiments, a completed semiconductor device 22 comprises a dielectric layer 24 (e.g., a patterned dielectric layer). A plurality of completed semiconductor devices 22 can be disposed on the support substrate 10 (as shown in FIG. 1B, for example).

In some embodiments, a completed semiconductor device 22 includes all of the elements necessary to function but does not necessarily include electrical connections to external power or signal sources that enable device operation, or necessarily include protective layers. FIG. 1B illustrates a horizontal LED structure with shaped, structured, and doped (e.g., implanted) semiconductor layers 20, a patterned dielectric layer 24 that defines vias, and two electrical contacts 25 through which electrical power can be transmitted to the semiconductor layers 20 to cause the completed semiconductor device 22 to operate. In FIG. 1B, the completed semiconductor device 22 results all of the photolithographic steps, such as processing and patterning steps, to make the completed semiconductor device 22 functional. A functional completed semiconductor device 22 is a device that provides a desired electronic, optical, thermal, mechanical, magnetic, electric field, photonic, or opto-electronic effect when provided with power but does not include the interconnections necessary to provide power or control signals, such as electrical power or control signals (e.g., from a controller).

Referring next to FIG. 1C, a patterned release layer 30 is formed or disposed on or over the completed semiconductor device 22 and optionally at least partly in contact with the support substrate 10 (as shown) in step 115. In some embodiments, a patterned release layer 30 does not contact a support substrate 10. A patterned release layer 30 can be formed or disposed using photolithographic methods and materials and can include germanium, Si, TiW, Al, Ti, a lift-off resist, or other polymers. In some embodiments, a patterned release layer 30 material can etch in developer, is not photo-active, or can etch at a higher temperature than photo-active materials such as photo-resists (e.g., greater than 200° C., 300° C., or 400° C.). In some embodiments, a patterned release layer 30 forms a gap 32 or space, for example, after etching the patterned release layer 30 material. For example, a gap can be formed between a completed semiconductor device 22 and a bonding layer 40 after the patterned release layer 30 has been removed.

Figure 1D:
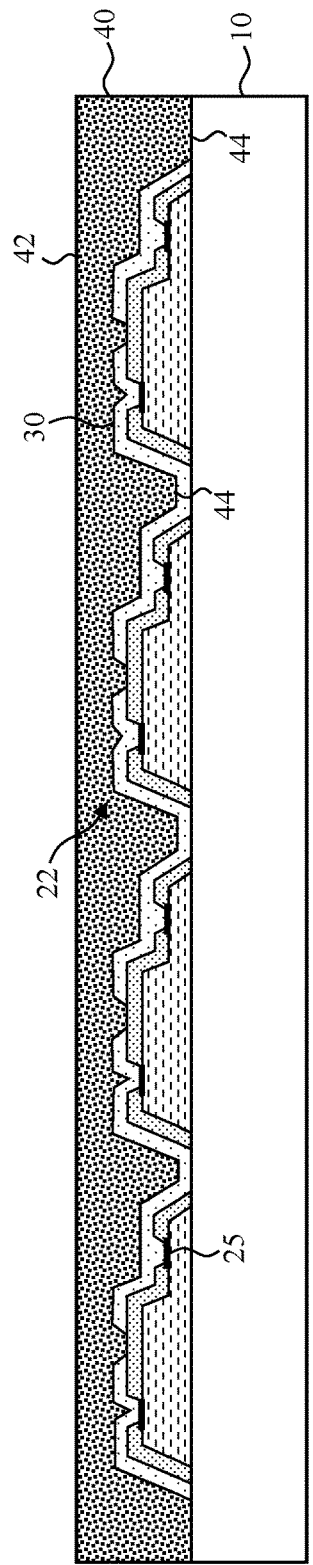

Referring to FIGS. 1D and 1E, a handle substrate 50 is provided in step 125, for example, a glass substrate or a plastic substrate. A conformable and curable bonding layer 40 is disposed on the patterned release layer 30 (as shown in FIG. 1D) or on the handle substrate 50 (or on an optional capping layer, discussed further subsequently with respect to FIG. 2C) in step 130. When a conformable and curable bonding layer 40 is disposed on a patterned release layer 30, a portion may also be disposed on a support substrate 10 (as shown in FIG. 1D). A conformable and curable bonding layer 40 can have a substantially planar side 42 opposite a non-planar side 44 closer to a completed semiconductor device 22. A handle substrate 50 can be substantially transparent, for example 50%, 70%, or 90% transparent to at least one of visible, UV, and IR electromagnetic radiation. A bonding layer 40 can be, for example, a curable resin, epoxy, SU-8, a metal layer, a metal alloy layer, a solder layer, or AuSn. The handle substrate 50 is located in contact with the bonding layer 40 and bonded to the completed semiconductor devices 22, for example, by curing the bonding layer 40 in step 135 (as shown in FIG. 1E) by providing heat, by cooling, or by providing electromagnetic radiation (e.g., UV light) to the bonding layer 40, for example through the handle substrate 50. Curing a bonding layer 40 can include forming a chemical reaction in a material of the bonding layer 40 or hardening the bonding layer 40, or by facilitating a phase change from a liquid to a solid (as with a solder). A bonding layer 40 can be cured by exposing the bonding layer 40 material to light or heat (for example if the bonding layer 40 is a UV-curable resin) or by exposing the bonding layer 40 to heat to melt a metal or metal alloy, disposing a structure in contact with the melted metal or metal alloy, and then cooling the metal. Thus, in some embodiments of the present invention, a metal or metal alloy bonding layer 40 is deposited, heated to melt the metal bonding layer 40 to a liquid, a handle substrate 50, a capping layer 60, or a release layer 30 is brought into contact with the melted liquid metal bonding layer 40, and the melted metal bonding layer 40 is cooled to a solid to adhere the bonding layer 40 to the handle substrate 50, capping layer 60, or release layer 30.

Referring to FIG. 1F, the support substrate 10 is removed to expose the completed semiconductor device 22 and optionally expose a portion of the patterned release layer 30 to the local environment (as shown) in step 140. In some embodiments, removing a support substrate 10 to expose a completed semiconductor device 22 comprises removing one or more additional layers (e.g., dielectric layers, spacing layers, adhesion layers, growth layers, or removal layers) disposed between the support substrate 10 and the completed semiconductor device 22. If at least a portion of the patterned release layer 30 is not exposed, an entry path 34 is formed to expose a portion of the patterned release layer 30 (as shown in FIG. 2H, and discussed further subsequently) in step 145. For example a portion of a layer that partially covers a patterned release layer 30 can be removed to form an entry path 34. A support substrate 10 can be removed, for example, by one or more of laser liftoff, ablation, laser ablation, etching, and grinding. In some embodiments, both grinding and another removal technique, such as etching, are used.

Figure 1G:
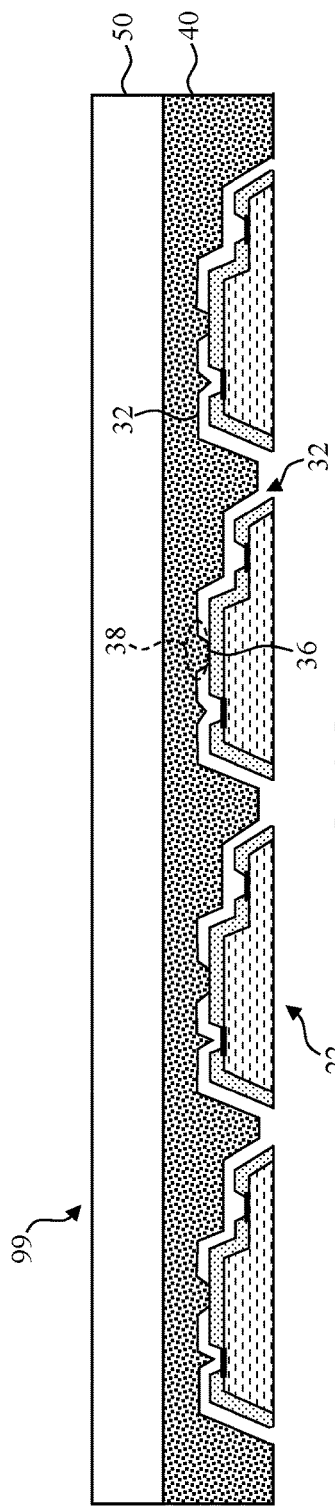

As shown in FIG. 1G, the release layer 30 is removed in step 150, for example by etching with $H_2O_2$, $XeF_2$, HCl, HF, trimethylammonium hydroxide (TMAH), or oxygen plasma. The selection of etchant can depend on the material of the patterned release layer 30. For example, $H_2O_2$ or $XeF_2$ can be used with a Ge, W, or TiW release layer 30, $XeF_2$ can be used with a Si release layer 30, HCl acid mixtures can be used with an Al or Ti release layer 30, TMAH-based developers can be used with a lift-off resist release layer 30, and oxygen plasma can be used with polyimide, epoxy, PMMA, or other organic release layers 30. In some embodiments, an etchant is benign to materials found in or exposed on the surface of a completed semiconductor device 22, a bonding layer 40, or both. After etching, a patterned release layer 30 forms a gap 32 or space between a completed semiconductor devices 22 and a bonding layer 40. Referring to FIG. 1G, the release layer 30 is patterned so that a tether 36 physically connects the completed semiconductor devices 22 to an anchor 38 portion of the bonding layer 40 and holds the completed semiconductor devices 22 in place. Generally, an anchor 38 can be a portion of a handle substrate 50 or a layer disposed on the handle substrate (e.g., between the handle substrate 50 and a completed semiconductor device 22), such as, for example, a bonding layer, a capping layer (not shown in FIG. 1G), or a dielectric layer 24. In the illustrative embodiment illustrated in FIG. 1G, the tether 36 is an interface to a post forming the anchor 38. In this embodiment, the anchor 38 is a portion of the bonding layer 40. The interface can, for example, provide a weak adhesion, for example adhesion provided by van der Waal's forces, and can be an interface with or of metal such as gold, tin, or a solder disposed on a portion of the completed semiconductor device 22.

Figure 1H:
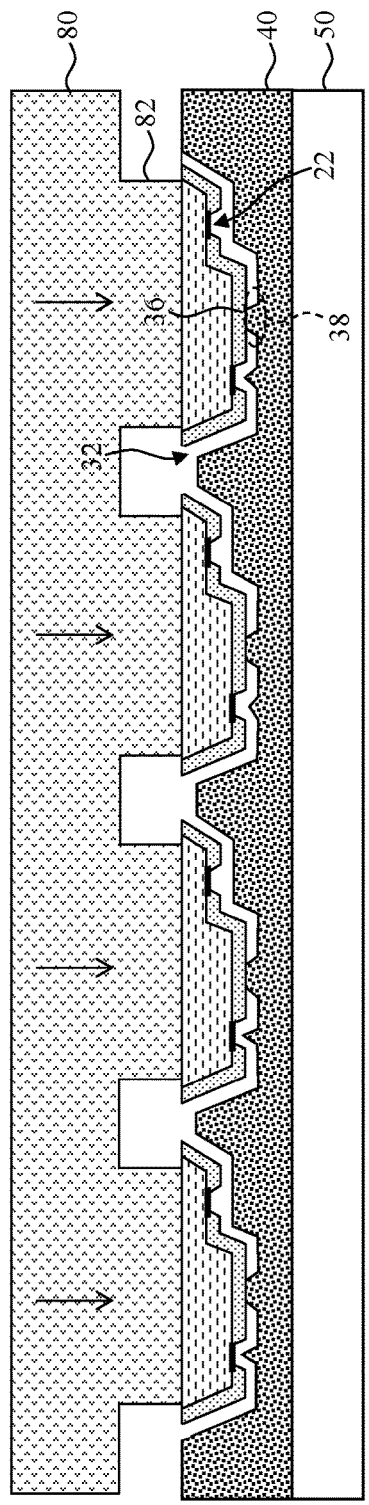
Figure 1I:
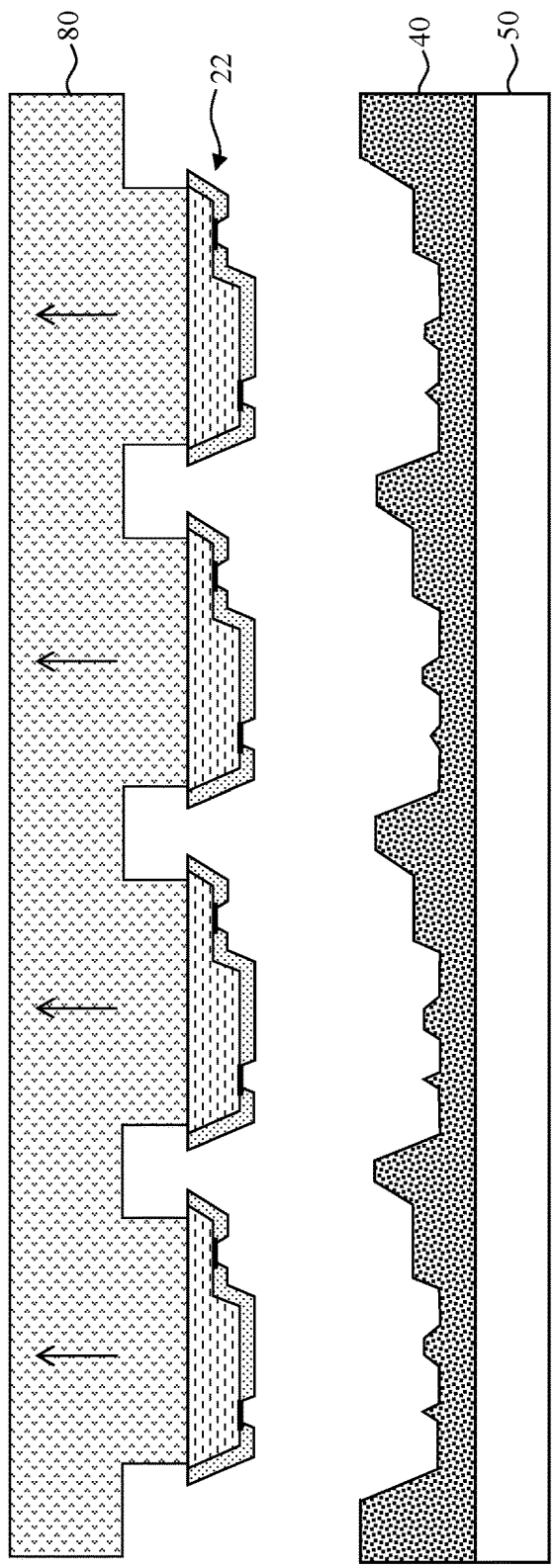
Figure 1J:
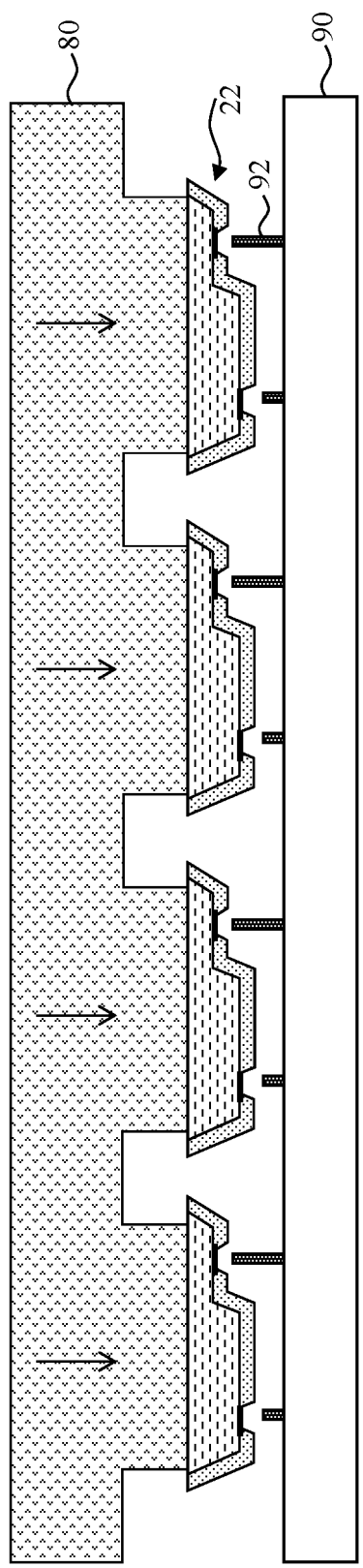

Once the release layer 30 is etched, the completed semiconductor devices 22 can be micro-transfer printed in step 160, as illustrated in FIG. 1H (shown with an inverted orientation from FIG. 1G), with a stamp 80 (e.g., an elastomeric stamp, for example comprising PDMS) comprising stamp pillars 82 that press against and adhere to the completed semiconductor devices 22 and is then separated from the handle substrate 50 (as shown in FIG. 1I). Referring to FIG. 1J, the completed semiconductor devices 22 are brought into aligned contact with a destination substrate 90 (the destination substrate 90 is provided in step 155) and adhered to the destination substrate 90. In some embodiments, electrical contacts 25 of a completed semiconductor device 22 are electrically connected to contact pads 92 formed or disposed on a destination substrate 90. Contact pads 92 can be electrically connected to an electrical circuit, for example through electrical conductors on the destination substrate 90 (not shown), to provide electrical power and signals to a completed semiconductor device 22.

Figure 2A:
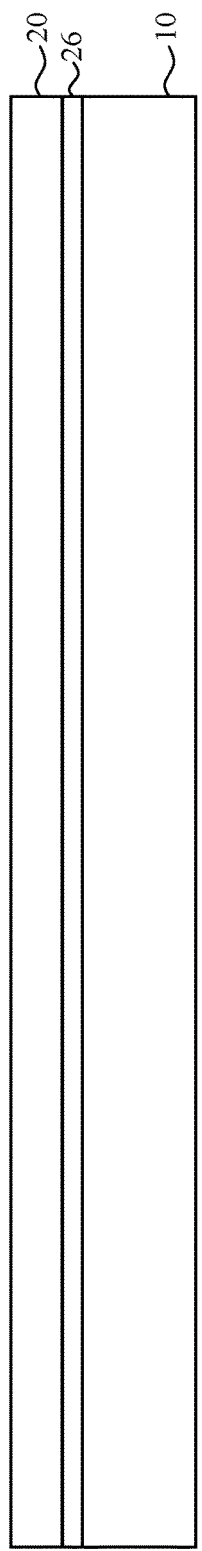
Figure 2B:
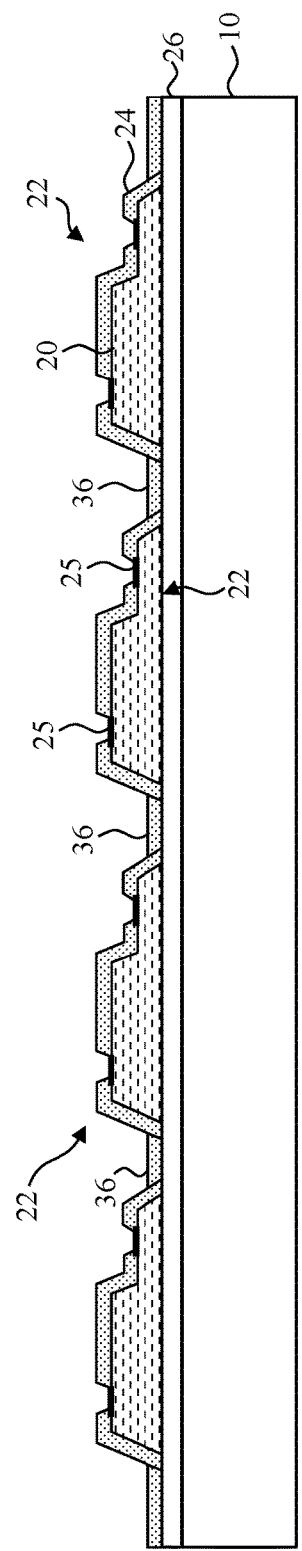
Figure 2E:
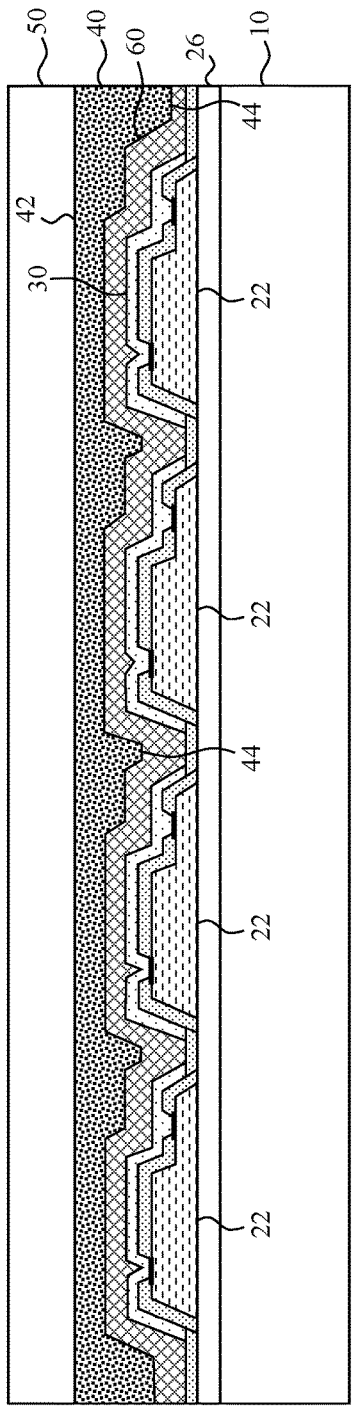
Figure 2F:
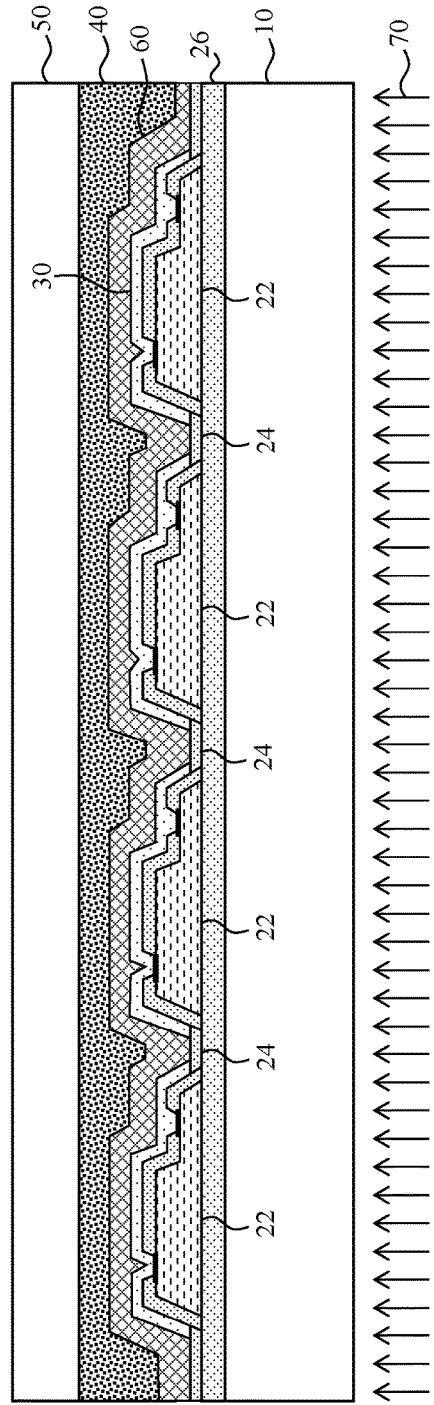
Figure 2I:
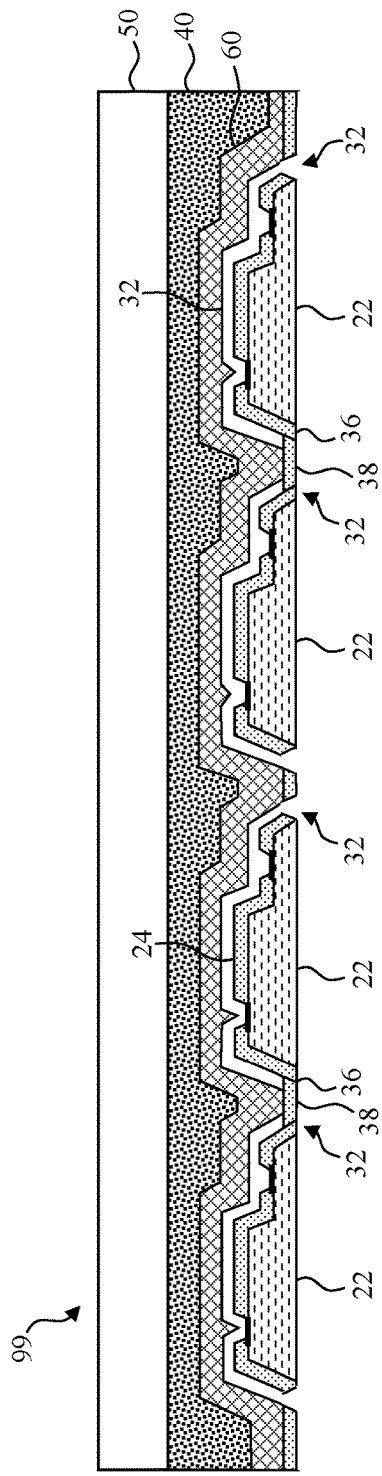

In some embodiments of the present invention, and referring to FIGS. 2A-2K, an alternative exemplary method of making a semiconductor structure 99 (as shown in FIG. 2G-2I) suitable for micro-transfer printing includes additional steps and elements as compared to the process and semiconductor structure 99 described with respect to FIGS. 1A-1J. Referring to FIG. 2A and again to FIG. 9, a support substrate 10 is provided in step 100 that includes a removal layer 26. A removal layer 26 can be an ablation layer or an etch-stop layer and can be a layer of a support substrate 10 or a layer disposed on the support substrate 10. A removal layer 26 can be patterned. Ablation and etch-stop layers can include one or more of (i) $SiO_x$ or $SiN_x$ deposited by, for example, plasma-enhanced chemical vapor deposition (PECVD) and (ii) organic layers with or without particles. Additional layers, such as buffer layers (e.g., C-GaN, AlGaN, or doped GaN) or one or more semiconductor growth layers can be provided as well.

A completed semiconductor device 22 (i.e., in this exemplary method by disposing one or more semiconductor layers 20 in, on, or over the support substrate 10) in step 105 (as shown in FIG. 2A). A completed semiconductor device 22 can be formed by disposing one or more layers or substructures on a support substrate 10. The one or more semiconductor layers 20 can be processed in step 110 to form the completed semiconductor device 22 (as shown in FIG. 2B) over or in contact with the removal layer 26, as described previously. In some embodiments, and as is shown in FIG. 2B, a dielectric layer 24 of a completed semiconductor device 22 is patterned to extend beyond the completed semiconductor device 22 (e.g., for use in forming anchors 38 and/or tethers 36).

Referring next to FIG. 2C, a patterned release layer 30 is formed or disposed on or over the completed semiconductor device 22 in step 115. As shown in FIG. 2C, a patterned release layer 30 can be at least partially in contact with a dielectric layer 24 rather than a support substrate 10 (in contrast to what is shown in FIG. 1C). In some embodiments (not shown), a patterned release layer 30 is at least partially in contact with a removal layer 26. Referring to FIG. 2C, a capping layer 60 is disposed on the release layer 30 in step 120. A capping layer 60 is optional and is not present in some embodiments. A capping layer 60 can be deposited using photolithographic methods such as evaporation, sputtering, plating, atomic layer deposition (ALD), or coating and can include organic or inorganic materials such as $SiN_x$, $SiO_x$, copper, nickel, or other materials. A capping layer 60 can be non-planar, patterned, structured or shaped, can stiffen the semiconductor structure 99, or can include multiple layers of different materials that can be selected and formed to control acoustic or mechanical vibrations. Referring to FIGS. 2D and 2E, a handle substrate 50 is provided in step 125 and a conformable and curable bonding layer 40 is disposed on the optional capping layer 60 (as shown) or on the handle substrate 50 (not shown), in step 130. A conformable and curable bonding layer 40 can have a substantially planar side 42 opposite a non-planar side 44 closer to a completed semiconductor device 22. A handle substrate 50 can be substantially transparent, for example 50%, 70%, or 90% transparent to at least one of visible, UV, and IR electromagnetic radiation. A bonding layer 40 can be, for example, a curable resin, epoxy, SU-8, a metal layer, a metal alloy layer, a solder layer, or AuSn.

The handle substrate 50 is located in contact with the bonding layer 40 and bonded to the completed semiconductor devices 22 by, for example, curing the curable bonding layer 40 in step 135 (as shown in FIG. 2E), for example by providing time, heat, cooling, or electromagnetic radiation to the bonding layer 40, for example through the handle substrate 50. The material of the capping layer 60 provided in step 120 can be selected to prevent unwanted interactions between the release layer 30 etching chemistry and the bonding layer 40. For example, in some embodiments, an etchant that is suitable for etching the release layer 30 might also undesirably etch the bonding layer 40, resulting in compromise a micro-transfer printing process for the completed semiconductor device 22 if not for the presence of the optional capping layer 60.

Referring to FIG. 2F, the support substrate 10 is removed in step 140. In some embodiments, and as shown in FIG. 2F, a removal layer 26 is exposed to electromagnetic radiation 70 (for example from a laser) through a support substrate 10 (i.e., wherein the support substrate 10 is at least partially transparent to the electromagnetic radiation 70) to decompose at least a portion of the removal layer 26, as illustrated with shading in the removal layer 26 in FIG. 2F. In some embodiments, a removal layer 26, for example an ablation layer, absorbs is heated by the electromagnetic radiation 70 and evaporates or sublimates to a gas or plasma that forcefully dissociates a support substrate 10 from the removal layer 26. Ablation layers can be selected to complement the support substrate 10 or layer materials formed on or in the support substrate 10. An ablation layer can be the same material as is found in the semiconductor layers 20, for example GaN. Moreover, in some embodiments, GaN can serve as an ablation layer for sapphire or AlN support substrates 10. GaNAs or InGaNAsSb can be included in ablation layers or materials grown on GaAs substrates. InGaAs, InGaAsP, AlInGaAs, or AlInGaAsP can be included in ablation layers or materials grown on InP substrates. In some embodiments, black chromium can be an ablation layer. Ablation layers can include organic materials such as vaporizable polymer or materials that incorporate light-absorbing particles such as carbon black or oxidized chromium and that can absorb electromagnetic radiation, facilitate ablation layer heating, and ablate of the layer.

Typically, laser ablation transfers momentum to a surface and, in some embodiments of the present invention, can form a shock wave (an acoustic or mechanical pulse of high pressure) that passes into and through a completed semiconductor device 22 (or completed semiconductor devices 22, if multiple are present) and can damage the completed semiconductor device 22. A capping layer 60 (and, in some embodiments, to some extent, a bonding layer 40 and/or a release layer 30) can dissipate, disperse, deflect, reflect, or absorb the shock wave and prevent or mitigate damage to a completed semiconductor device 22. The layers, materials, and structure of a capping layer 60 can be specifically designed to prevent or mitigate damage to a completed semiconductor device 22. In some embodiments, a release layer 30 comprises germanium, which has a large acoustic impedance and can therefore effectively reflect or redirect at least a portion of a shock wave. In some embodiments of the present invention, laser ablation can be used to remove a support substrate 10 from a semiconductor structure 99 used in a flip-chip micro-transfer printing process, as shown in FIG. 2G.

In some methods and micro-transfer printable semiconductor structure 99 designs, removal of a support substrate 10 exposes the release layer 30 (e.g., as shown in FIG. 1F). However, in some embodiments, and as illustrated in FIG. 2G, a release layer 30 is not exposed in step 140. For example, a release layer can be covered by a dielectric layer 24. In some embodiments, a dielectric layer 24 is patterned to expose a portion of a release layer 30, as shown in FIG. 1F. However, in the illustrative embodiment shown in FIGS. 2F and 2G, the patterned dielectric layer 24 is not exposed when the support substrate 10 is removed. Thus, as illustrated in FIG. 2H, in step 145 an entry path 34 is formed to expose a portion of the patterned release layer 30. An entry path 34 can be formed, for example, by pattern-wise etching a dielectric layer 24 (or other layer disposed over a patterned release layer 30). In some embodiments, the step of forming an entry path 34 is the same step as removing a support substrate 10. That is, in some embodiments, removing a support substrate 10 forms an entry path 34 by exposing a portion of a release layer 30. As used herein, an "exposed" layer or element is one that is exposed to the local environment, can be exposed to a processing material such as a chemical etchant, can have materials deposited thereon, or any combination thereof. In some embodiments, a layer (e.g., a support substrate 10) is removed to expose an element (e.g., a completed semiconductor device 22) while one or more other layers (e.g., dielectric layers or a remaining portion of a removal layer 26) remain that need to be removed to provide an exposed element. For example, in some embodiments, a support substrate 10 is removed to expose a completed semiconductor device 22 and subsequently a sacrificial dielectric layer and/or remaining portion of a removal layer 26 disposed on the completed semiconductor device 22 is removed thereby providing an exposed completed semiconductor device 22.

Referring to FIG. 2I, the release layer 30 is removed in step 150, for example by etching as described above with respect to FIG. 1G. After etching, the release layer 30 forms a gap 32 or space between the completed semiconductor devices 22 and the capping layer 60. A release layer 30 and entry paths 34 are patterned so that one or more tethers 36 physically connect a completed semiconductor devices 22 to an anchor 38 disposed on the handle substrate 50 (e.g., wherein the anchor 38 is a portion of a dielectric layer 24, a capping layer 60, a handle substrate 50, or another layer disposed on the handle substrate 50) holds the completed semiconductor device 22 in place. Referring to FIG. 2I, the completed semiconductor devices 22 are physically connected to the anchors 38, where are portions of the dielectric layer 24. In some embodiments, a plurality of tethers 36 physically connect each completed semiconductor device 22 to one or more anchors 38 (e.g., a plurality of anchors 38). In some embodiments, a plurality of anchors 38 formed from portions of a bonding layer are physically connected to each completed semiconductor device 22. In the illustrative embodiment illustrated in FIG. 2I, each tether 36 is a portion of the dielectric layer 24. A tether 36 can be disposed in a common plane with an entry path 34 or an entry path 34 can extend through or around a tether 36. A tether 36 can be separated or broken (e.g., fractured) if pressure is applied to a completed semiconductor device 22. In some embodiments, a tether 36 is separated during transfer printing (e.g., by overcoming van der Waals forces that adhere a completed semiconductor device 22 to an anchor 38). In some embodiments, a tether 36 is fractured during transfer printing (e.g., wherein pressure fractures the dielectric material that the tether 36 is made from).

Figure 2J:
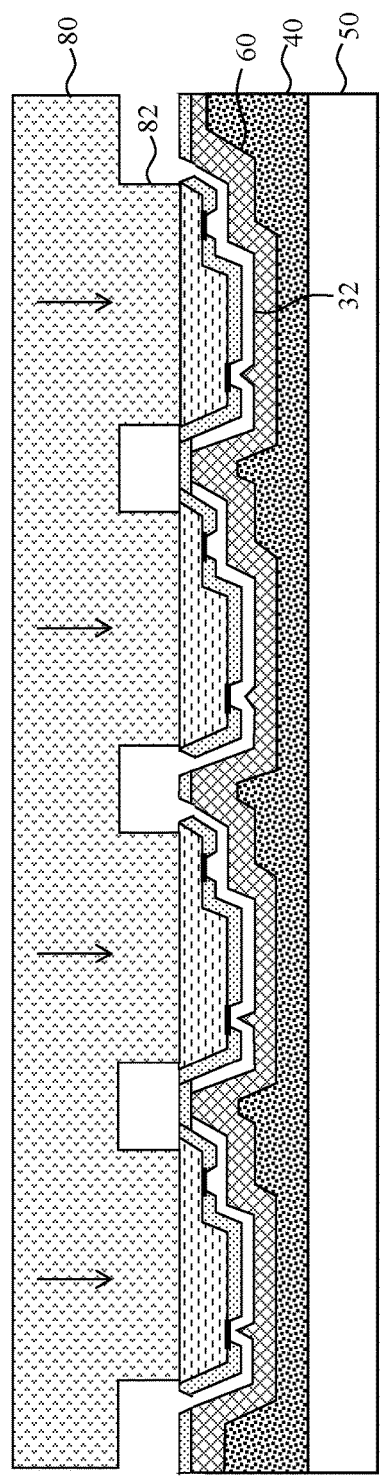
Figure 2K:
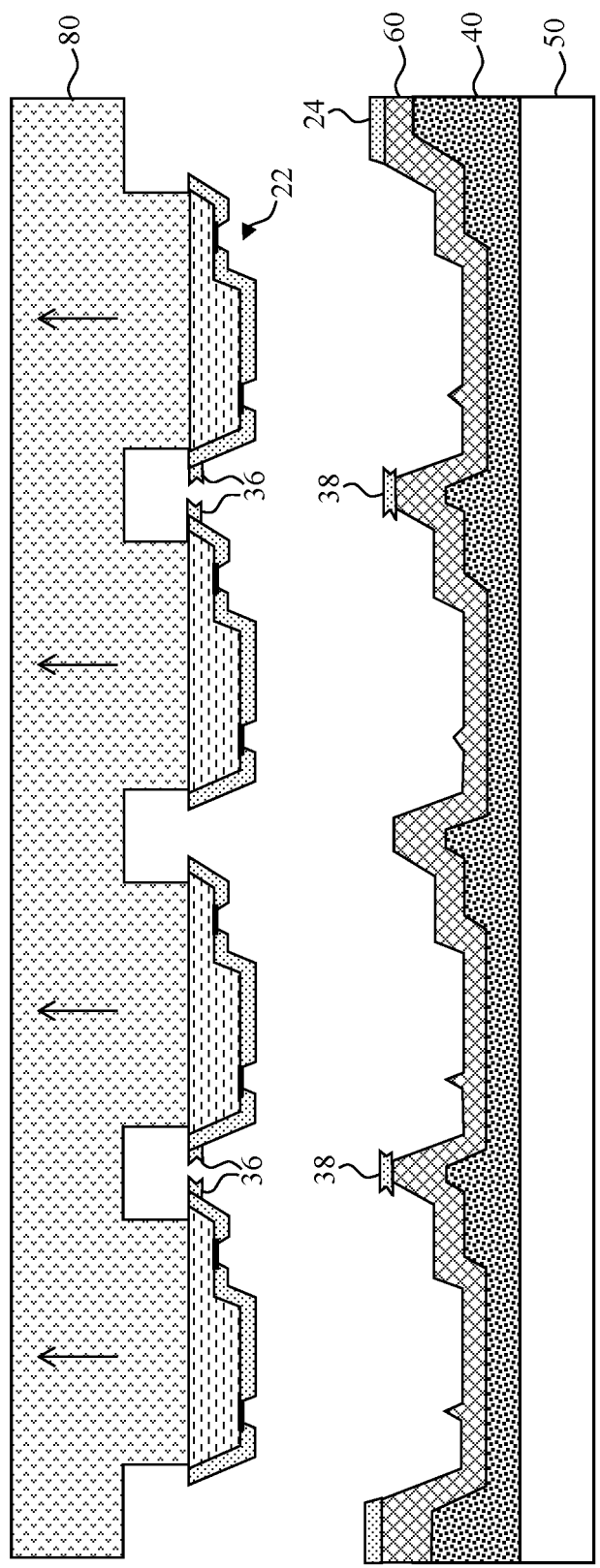

Once the release layer 30 is etched, the completed semiconductor devices 22 can be micro-transfer printed in step 160, as illustrated in FIG. 2J (shown with an inverted orientation from FIG. 2I), with a stamp 80 (e.g., an elastomeric stamp, for example comprising PDMS) comprising stamp pillars 82 that press against and adhere to the completed semiconductor devices 22 and is then separated from the handle substrate 50 (as shown in FIG. 2K). The completed semiconductor devices 22 are brought into aligned contact with a destination substrate 90 and micro-transfer printed to the destination substrate 90, as shown and described with respect to FIG. 1J.

Figure 3A:
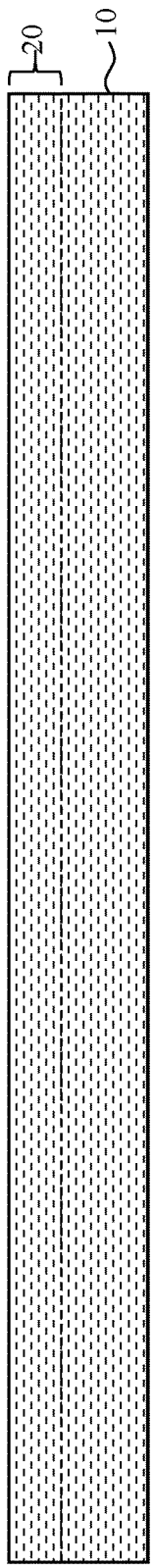
FIGS. 3A-3B are successive cross sections illustrating sequential steps in an exemplary method, according to illustrative embodiments of the present invention.
Figure 3B:
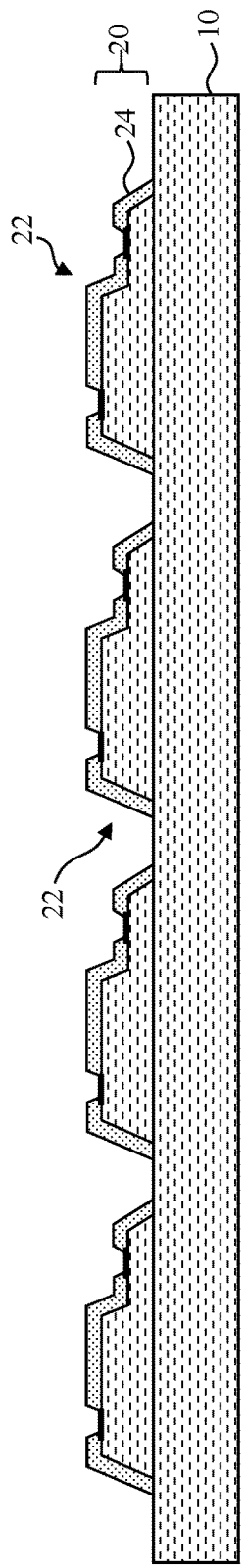

Referring next to FIG. 3A, in some embodiments, semiconductor layer(s) 20 are formed in a support substrate 10, for example by doping (e.g., implanting) the support substrate 10 to form a layer on or at a surface (e.g., within the surface) of the support substrate 10 in step 105 that is the semiconductor layer(s) 20. The semiconductor layer(s) 20 can be processed in step 110 to form the completed semiconductor devices 22 (as shown in FIG. 3B). Thus, forming semiconductor layer(s) 20 in step 105 can include forming a layer on the support substrate 10 (as shown in FIGS. 1A, 2A) or forming a layer in the support substrate 10 (as shown in FIG. 3B).

Figure 4:
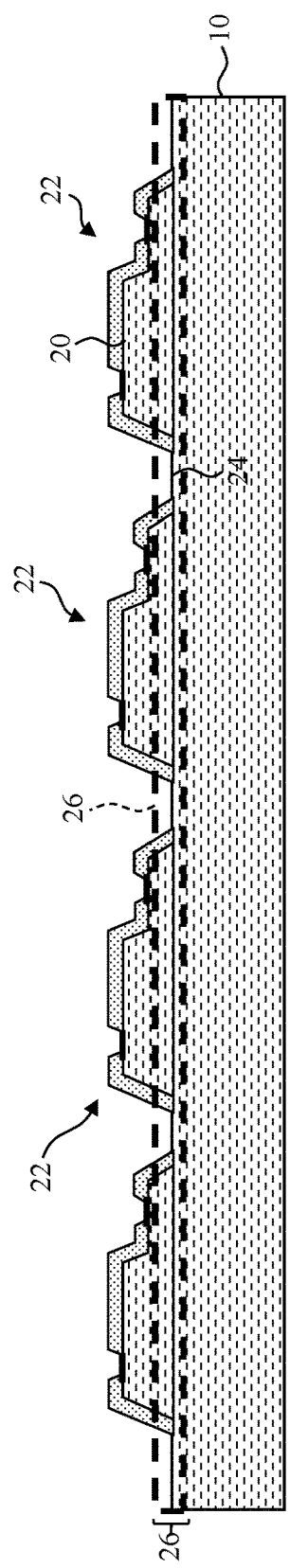
FIG. 4 is a cross section illustrating a semiconductor device with an ablation layer, according to illustrative embodiments of the present invention.

In some embodiments, and as shown in FIG. 4, a removal layer 26 is a portion of a completed semiconductor devices 22 and possibly other layers or a portion of a support substrate 10 (in which case the removal layer 26 includes a portion or layer of the support substrate 10). For example, in some embodiments, ablation can remove the portion of the structure indicated with the heavy dashed rectangle. Thus, in some embodiments, removing a support substrate 10 (e.g., as in step 140) comprises exposing semiconductor layer(s) 20 or completed semiconductor device 22 to electromagnetic radiation 70 through the support substrate 10 to decompose a portion of the semiconductor layer(s) 20 or the completed semiconductor device 22 and form a shock wave in a semiconductor structure 99. A capping layer 60, if present, can disperse, reflect, deflect, or absorb the shock wave.

Referring to FIG. 2K, each completed semiconductor device 22 has at least one individual broken (e.g., fractured) tether 36 as a consequence of micro-transfer printing. A broken tether 36 can be a fractured structure, as in FIG. 2K. A separated tether 36 can be an interface formed between two elements for which one element is removed, as in FIG. 1I. However, before tethers 36 are broken (as shown in FIG. 2J), two or more tethers 36 can be part of a common structure and be physically connected to a common anchor 38. Anchors 38 can be any portion of a semiconductor structure 99 that is not the completed semiconductor device 22, for example a bonding layer 40 (as shown in FIG. 1G), a dielectric layer 24 (as shown in FIG. 2I), or a capping layer 60.

Figure 5:
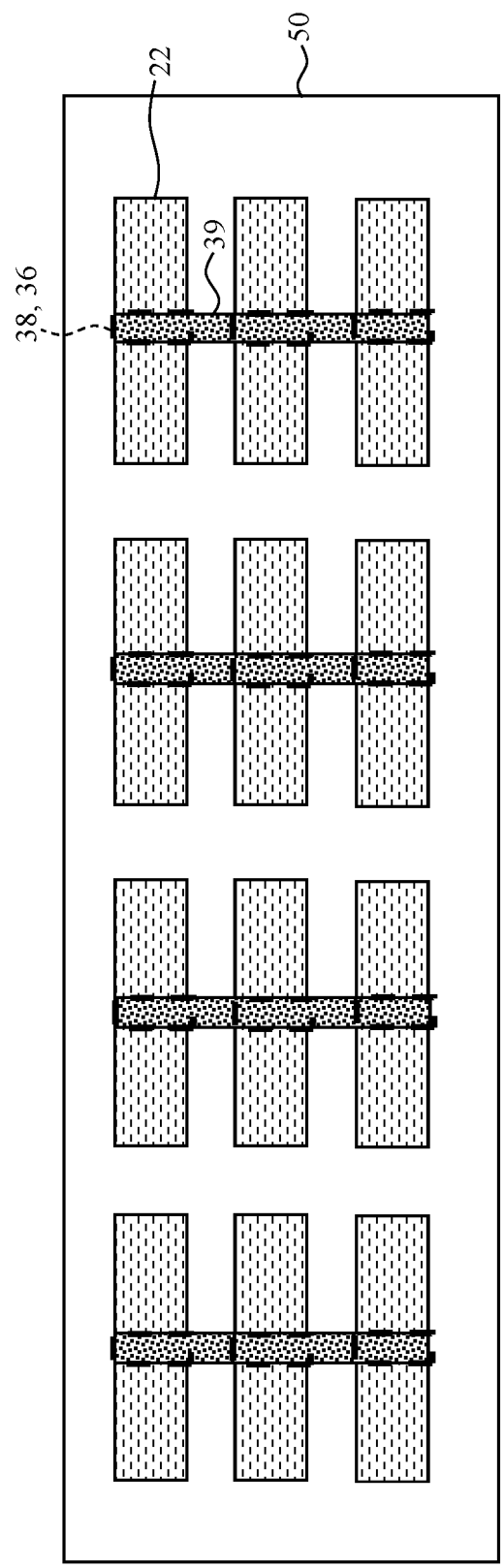
FIG. 5 is a plan view illustrating anchor, an anchor structure, and semiconductor devices on a source substrate, according to illustrative embodiments of the present invention.

Referring to the plan view of FIG. 5 and corresponding to the cross section of FIG. 1G viewed through the handle substrate 50 and excluding non-anchor portions of the bonding layer 40, in some embodiments, at least two of the plurality of completed semiconductor devices 22 are tethered to anchors 38 that are portions of an anchor structure 39 that is a ridge of material (e.g., that physically connects to each of two or more completed semiconductor devices 22 at an interface that is a tether 36). In the illustrative embodiment of FIG. 5, each anchor structure 39 comprises three anchors 38 physically connected to the tethers 36 of three corresponding completed semiconductor devices 22. In some embodiments, an anchor structure 39 comprises a plurality of anchors 38 (e.g., two or more or three or more anchors).

In some embodiments of the present invention (not shown), a completed semiconductor device 22 has a semiconductor structure with a planar surface adjacent to a patterned release layer 30 opposite a support substrate 10 so that electrical contacts 25 of the completed semiconductor device are in a common plane. This arrangement facilitates electrical connection between the electrical contacts 25 and contact pads 92 on a destination substrate 90. In some embodiments, contact pads 92 are likewise in a common plane on a surface of a destination substrate 90, so that electrical contacts 25 in a common plane can both contact each contact pad 92 at the same time. However, in some embodiments and as illustrated in FIGS. 1B-C and 2C, a completed semiconductor device 22 has a semiconductor structure with a non-planar surface adjacent to a patterned release layer 30 and opposite a support substrate 10 so that electrical contacts 25 are not in a common plane. Thus, it can be necessary to adjust the structure or arrangement of the completed semiconductor device 22 or destination substrate 90 in order to form an electrical connection between the completed semiconductor device 22 and contact pads 92 on the destination substrate 90 when the completed semiconductor device 22 is transfer printed (e.g., micro-transfer printed) to the destination substrate 90.

In some embodiments, and as shown in FIG. 1J, a destination substrate 90 has a non-planar surface with a topography that corresponds to a non-planar completed semiconductor device 22 surface. Accordingly, contact pads 92 (which provide at least a portion of the surface topography of a destination substrate 90) can have different heights that correspond to different locations of a non-planar completed semiconductor device 22 surface, in particular the different heights of the electrical contacts 25 of the completed semiconductor structures 22 over the destination substrate 90, so that the contact pads 92 can readily make electrical connections with the electrical contacts 25.

Figure 6A:
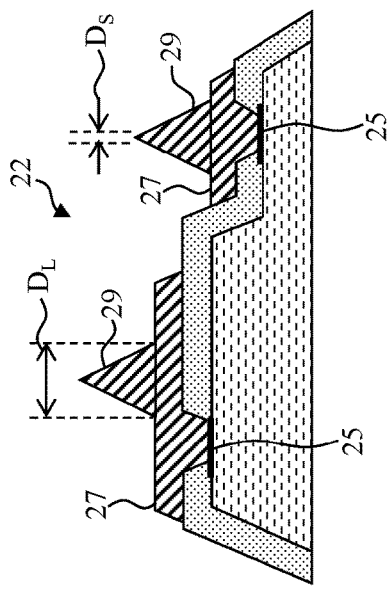

In some embodiments, and referring to FIGS. 6A-6E, the structure of the completed semiconductor devices 22 is adapted with electrodes 27 and/or connection posts 29. Referring to FIG. 6A, the completed semiconductor device 22 includes a non-semiconductor structure (electrodes 27) electrically connected to the electrical contacts 25 on a side of the completed semiconductor device 22 opposite a support substrate 10 (not shown). Exposed portions of the electrodes 27 together form at least a portion of a common planar surface for the completed semiconductor device 22 and provide a surface for forming electrical connections. The electrodes 27 are electrically connected to the electrical contacts 25. When flipped and micro-transfer printed onto a destination substrate 90 (e.g., in accordance with FIG. 1J), the exposed portions of the electrodes 27 can be in contact with and can readily electrically connect to planar contact pads 92 on the destination substrate 90. Since the electrical contacts 25 are not in a common plane, each of the electrodes 27 have a different thickness, $D_L$, $D_S$, as shown, to provide a surface that is in a common plane. Electrodes 27 can be electrically conductive and made of metal or a conductive metal oxide and can be formed using conventional photolithographic methods, for example deposition [e.g., by chemical evaporation or physical vapor deposition (e.g., sputtering)] and patterning (e.g., by pattern-wise etching). Different thicknesses $D_L$, $D_S$ can be achieved by multiple deposition and patterning steps.

In some embodiments, each electrical contact 25 includes a connection post 29. In some embodiments, referring to FIG. 6B, each electrical contact 25 is electrically connected to an electrode 27 and a connection post 29 is electrically connected to each electrode 27. In some embodiments, an electrode 27 includes or forms a connection post 29. Connection posts 29 can be electrically conductive and, for example, can be made of metal or a conductive metal oxide, as can the electrodes 27 and made using photolithographic methods and materials. Connection posts 29 can be made of the same material(s) as electrodes 27 and can be made in common steps or processes. A connection post 29 and corresponding electrode 27 can be a common structure so that it can be considered that the connection post 29 includes the electrode 27 or the electrode 27 includes the connection post 29. In some embodiments, a connection post 29 protrudes from a surface of a completed semiconductor device 22 and, when micro-transfer printed to a destination substrate 90, can electrically connect to contact pads 92 on the destination substrate 90.

Figure 6B:
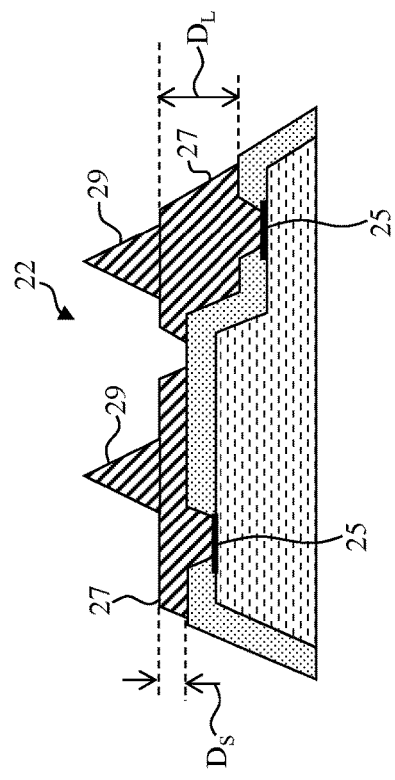

In some embodiments, referring to the connection posts in FIG. 6B, to facilitate electrically connecting connection posts 29 to contact pads 92, each connection post 29 has a first surface adjacent to a surface of a completed semiconductor device 22 and a second opposing surface, wherein the second opposing surface has a smaller area or dimension $D_S$ than an area or dimension $D_L$ of the first surface. Therefore, for example, a connection post 29 can have a relatively sharp point and can form a spike, as shown in FIG. 6B. In some embodiments, a connection post 29 is cylindrical or has a constant rectangular cross section parallel to a surface of a completed semiconductor device 22. Furthermore, in some embodiments, a connection post 29 can have a height that is greater than a dimension of a cross section perpendicular to the height (e.g., a dimension of a first surface or a dimension of the second opposing surface as described in reference to FIG. 6B). Thus, in some embodiments, a connection post 29 has an elongated aspect ratio (e.g., a height to width aspect ratio greater than 1:1), a height that is greater than a width, and, optionally, a sharp point.

Figure 6C:
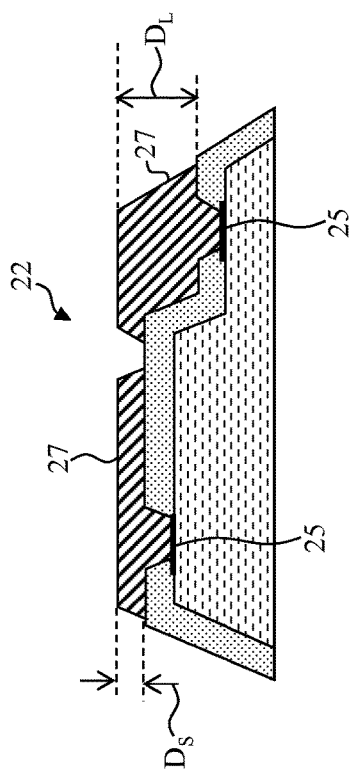
Figure 6D:
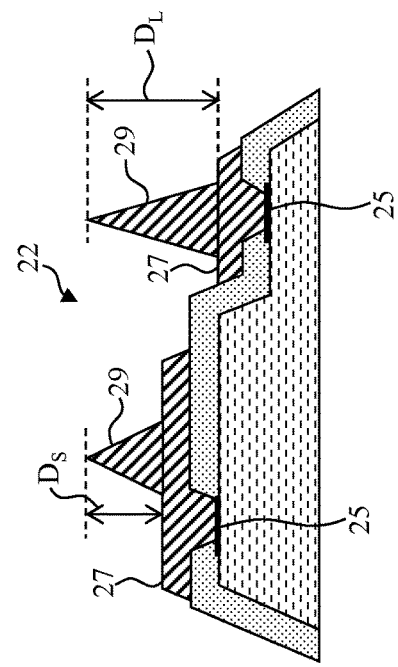

Referring to FIG. 6C, the connection posts 29 have different heights or dimensions $D_S$, $D_L$ so the different connection posts 29 have a common projection distance from the completed semiconductor device 22. In some embodiments, a plurality of connection posts 29 connected to a completed semiconductor device 22 terminate in a common plane. Referring to FIG. 6D, the structures of FIGS. 6A and 6B are combined to provide connection posts 29 that have a common projection distance from the completed semiconductor device 22 using different electrode 27 thicknesses $D_S$, $D_L$ and common connection post 29 sizes. Referring to FIG. 6E, surfaces at opposing edges of the completed semiconductor device 22 are in a common plane. A first one of the electrical contacts 25 is located at the bottom of a well, pit, or depression in the completed semiconductor device 22 and is electrically connected to a first electrode 27A. A second electrode 27B is in electrical contact with a second electrical contact 25 electrically separate from the first electrical contact 25. The first electrode 27A has a greater height $D_L$ than the height $D_S$ of the second electrode 27B so that exposed portions of the first and second electrodes 27A, 27B together are in a common plane. The electrodes 27 are in contact with and electrically connected to the electrical contacts 25. Exposed portions of the first and second electrodes 27A, 27B are used to make electrical contact to external electrical conductors, such as contact pads 92 on a destination substrate 90.

Referring to FIG. 6F, surfaces at opposing edges of the completed semiconductor device 22 are not necessarily in a common plane. A first one of the electrical contacts 25 is located at a lower location at the bottom of a well, pit, or depression in the completed semiconductor device 22 and is electrically connected to a first electrode 27A. A second electrode 27B is in electrical contact with a second electrical contact 25 electrically separate from the first electrical contact 25 at a higher location relative to the first one of the electrical contacts 25. However, the first electrode 27A extends from the lower location to the upper location over a surface of the completed semiconductor device. Thus, the first electrode 27A has a greater height $D_L$ than the height $D_S$ of the second electrode 27B so that exposed portions of the first and second electrodes 27A, 27B together are in a common plane in the upper location and exposed portions of the first and second electrodes 27A, 27B are in different planes in the upper and lower locations, respectively. Exposed portions of the first and second electrodes 27A, 27B are used to make electrical contact to external electrical conductors, such as contact pads 92 on a destination substrate 90.

Connection posts 29 can be formed by repeated masking and deposition processes that build up three-dimensional structures. In certain embodiments, for example those in which electrodes 27 have an exposed portion in a common plane such as in FIGS. 6A and 6D-6F, connection posts 29 can be formed by coating the electrodes 27 with a first polymer layer, for example a lift-off resist layer, coating the first polymer layer with a second polymer layer, for example a photoresist layer having different etching characteristics than the first polymer layer, patterning the second polymer layer to form vias in the second polymer layer, and etching the first polymer layer through the vias to form a deeper via having an undercut in the first polymer layer with respect to the second polymer layer via. A conductive metal, such as gold, can be evaporated over the second polymer layer to form an evaporated metal structure within the deeper via. Because the via is undercut in the first polymer layer, the base of the evaporated metal structure in the first polymer layer is wider than the top in the second polymer layer, for example forming a sharp point. The first and second polymer layers are then removed, for example using a lift-off technique, leaving a sharp-pointed connection post 29 formed on each of the first and second electrical contacts 25. The connection post 29 can be, for example gold (Au) with a width of 1.8 microns and a height of 4 microns. In some embodiments, a polymer structure with a width smaller than a width of the first and second electrical contacts 25 is formed on each of the first and second electrical contacts 25, for example by patterning a photoresist layer. A metal layer is then evaporated over the polymer structures to form an electrically conductive connection post 29 that is electrically connected to the electrical contacts 25. The remaining metal in the layer is then pattern-wise removed, for example by coating and patterning a photoresist layer, removing the exposed photoresist, etching the exposed metal layer, and then removing the remaining photoresist to expose the connection posts 29.

In some embodiments, connection posts comprise multiple layers [e.g., made of different materials (e.g., wherein each layer is made of a material that has a different elastic modulus)]. In some embodiments, connection posts 29 are made of one or more high elastic modulus metals, such as tungsten. As used herein, a high elastic modulus is an elastic modulus sufficient for a connection post 29 made of the material to maintain its function and structure when pressed into a contact pad 92 disposed on a destination substrate 90 (e.g., electrical conductivity does not degrade due to deformation). Connection posts 29 can be made by etching one or more layers of electrically conductive metal or metal oxide evaporated or sputtered on a side of semiconductor layers 20 opposite a support substrate 10. Connection posts 29 can have a variety of aspect ratios and typically have a peak area smaller than a base area. Connection posts 29 can have a sharp point for embedding in or piercing contact pads 92 of a destination substrate 90. Connection posts 29 that protrude from semiconductor devices generally are discussed in U.S. Pat. No. 8,889,485, the disclosure of which is incorporated by reference herein in its entirety.

Figure 7:
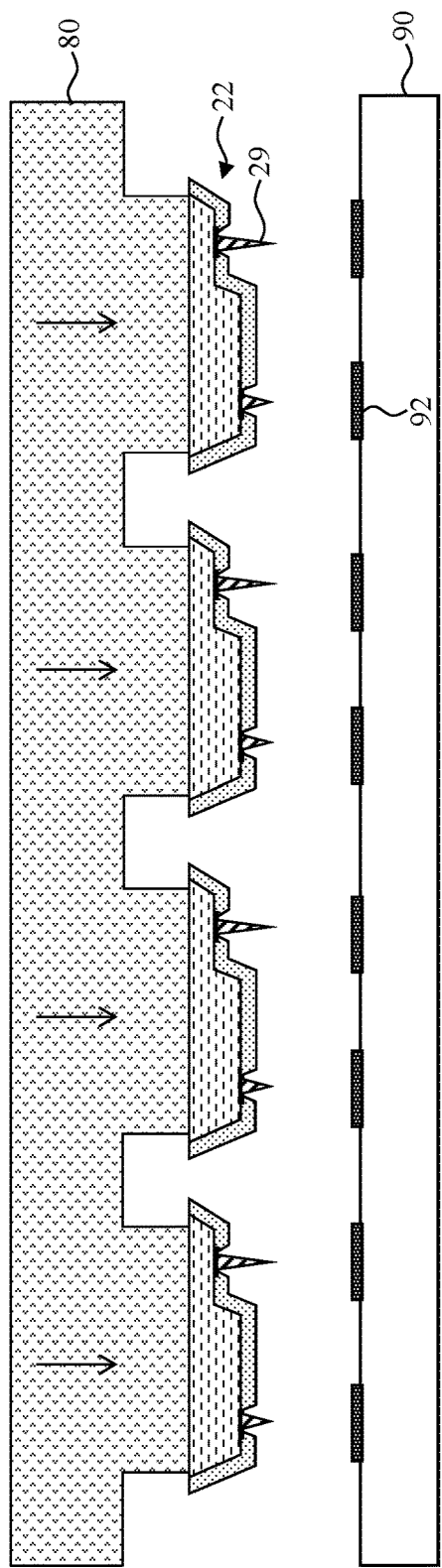
FIG. 7 is a cross section illustrating micro-transfer-printed completed semiconductor devices with a connection post structure and a destination substrate in accordance with an embodiment of the present invention.
Figure 8:
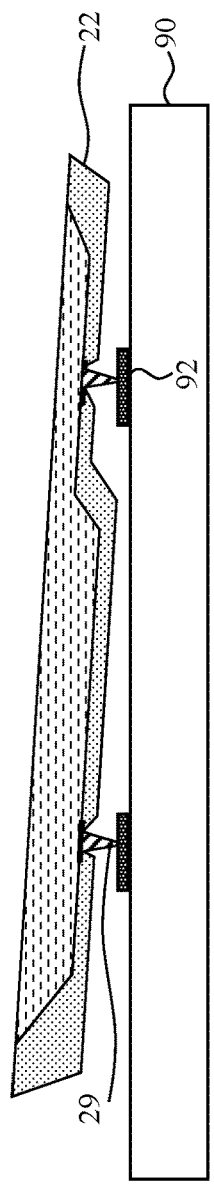
FIG. 8 is a cross section illustrating a completed semiconductor device with a connection post structure and a destination substrate, according to illustrative embodiments of the present invention.
Figure 9:
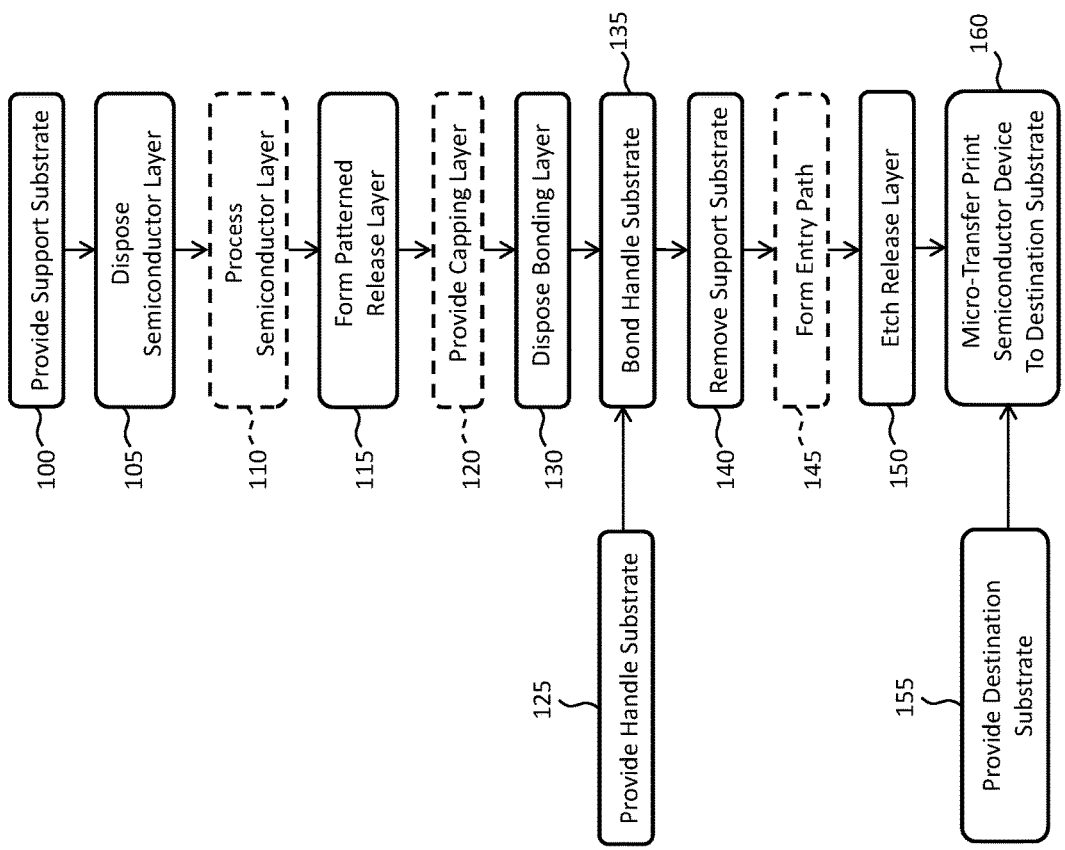
FIG. 9 is a flow chart illustrating exemplary methods, according to illustrative embodiments of the present invention.

Referring to FIGS. 7 and 8, in some embodiments of the present invention, completed semiconductor devices 22 in accordance with at least one of FIGS. 6B-6D are illustrated with a destination substrate 90 onto which the completed semiconductor devices 22 are micro-transfer printed. As shown in FIG. 7, the completed semiconductor devices 22 with connection posts 29 disposed thereon (e.g., in accordance with FIG. 6C or FIG. 6D) are micro-transfer printed onto the destination substrate 90 so that the connection posts 29 are aligned with and will pierce or otherwise electrically connect (e.g., by contacting) with the contact pads 92 of the destination substrate 90. Because the connection posts 29 extend a common projection distance from the completed semiconductor device 22, the top or bottom surfaces of the completed semiconductor devices 22 are substantially parallel to the destination substrate 90. In contrast, referring to FIG. 8, the completed semiconductor devices 22 (in accordance with FIG. 6B) have top or bottom surfaces of the completed semiconductor devices 22 that are not substantially parallel to the destination substrate 90 because the connection posts 29 do not project a common distance from the completed semiconductor device 22. However, because the size of the completed semiconductor devices 22 over the destination substrate 90 is relatively large compared to the difference in protrusion distance of the connection posts 29, the completed semiconductor devices 22 can be successfully printed onto the destination substrate 90 and successfully make an electrical connection to the contact pads 92. As shown in FIG. 8, the completed semiconductor device 22 is only slightly tilted or angled with respect to a surface of the destination substrate 90 after transfer printing.

According to some embodiments of the present invention, and as illustrated in FIGS. 1F-1G and 2G-2I, an exemplary semiconductor structure 99 suitable for micro-transfer printing made by a method disclosed herein includes a handle substrate 50, a cured bonding layer 40 disposed in contact with the handle substrate 50, an optional capping layer 60 disposed in contact with the bonding layer 40, a patterned release layer 30 disposed in contact with the cured bonding layer 40 or the capping layer 60 (if present), an entry path 34 existing between the patterned release layer 30 and the local environment, and one or more completed semiconductor devices 22 disposed on or over the patterned release layer 30 and attached to an anchor 38 disposed on the handle substrate 50 with at least one tether 36. A tether 36 can be disposed between a completed semiconductor device 22 and a handle substrate 50, for example, connecting the completed semiconductor device 22 to an anchor 38 post (e.g., wherein the tether 36 is a connection interface). In some embodiments, a tether 36 is disposed in a common plane with an entry path 34.

A completed semiconductor device 22 can include one or more of a semiconductor material, a compound semiconductor material, GaN, Si, InP, SiGe, and GaAs. A patterned release layer 30 can include one or more of germanium, Si, TiW, Al, Ti, a lift-off resist, and other polymers and, when etched or otherwise removed, forms a gap 32 or space (e.g., between a bonding layer 40 or a capping layer 60 and a completed semiconductor device 22). A curable bonding layer 40 can comprise or consist essentially of a curable resin, a curable epoxy, a metal layer, a metal alloy layer, a solder layer, or a layer of AuSn, for example. A cured bonding layer 40 can comprise or consist essentially of a cured resin, epoxy, a metal layer, a metal alloy layer, a solder layer, or a layer of AuSn, for example.

In some embodiments, a completed semiconductor device 22 can be exposed or the entry path 34 can be exposed. In some embodiments, a removal layer 26 (e.g., an ablation or etch-stop layer) is a portion, but only a portion, of a completed semiconductor device 22. In some embodiments, a semiconductor structure 99 includes a removal layer 26 in contact with a completed semiconductor device 22 and is disposed on or over, or is a part of, a support substrate 10 (e.g., can be patterned). In some embodiments, a support substrate 10 is in contact with a completed semiconductor device 22 or a removal layer 26 (and the removal layer 26 is in contact with the completed semiconductor device 22). A support substrate 10 can be one or more of sapphire, quartz, silicon, GaAs, GaN, InP, SiC, GaP, GaSb, AlN, and MgO. A support substrate 10 can be a growth substrate, can have a semiconductor seed layer, or can be a semiconductor layer 20.

A support substrate 10 can be removed by laser ablating a removal layer 26 disposed thereon or a portion of a completed semiconductor device 22, causing a mechanical or acoustic shock wave to propagate through the completed semiconductor device 22. To reduce or avoid damage from the shock wave, in some embodiments, a capping layer 60 has a thickness and layer material shape or structure to disperse, deflect, reflect, or absorb the shock wave. A capping layer 60 can have a plurality of layers and different materials.

In some embodiments, a completed semiconductor device 22 includes a semiconductor structure with a non-planar surface adjacent to a patterned release layer 30. A completed semiconductor device 22 can include a non-semiconductor structure in contact with the non-planar semiconductor structure surface adjacent to a patterned release layer 30 so that the non-semiconductor structure forms at least a portion of a planar surface for the completed semiconductor device 22.

In some embodiments, completed semiconductor devices 22 can be micro-transfer printed from a handle substrate 50 to a destination substrate 90. A destination substrate 90 can have a non-planar surface with a topography that corresponds to a non-planar semiconductor structure surface of the completed semiconductor device 22.

In some embodiments, a completed semiconductor device 22 includes an electrical contact 25 on the side of the completed semiconductor device 22 adjacent to a support substrate 10 or an electrical contact 25 on the side of the completed semiconductor device 22 adjacent to a patterned release layer 30 (as shown, for example, in FIG. 1B). In some embodiments, each electrical contact 25 includes an electrically conductive connection post 29. In some embodiments, an electrode is disposed on and electrically connected to each electrical contact 25 in a completed semiconductor device 22 and a connection post 29 is electrically connected to each electrode 27. In some embodiments, an electrode 27 includes or forms a connection post 29 or the connection post 29 includes or forms an electrode 27.

Connection posts 29 can have a first surface adjacent to a surface of the completed semiconductor device 22 and a second opposing surface with a smaller area than the first surface such that the connection posts are tapered. In some embodiments, a tapered connection post 29 has a height to width aspect ratio greater than 1:1, wherein the width of a connection post 29 is taken from a cross section of the connection post 29 perpendicular to the height dimension [e.g., taken as a maximal width of the connection post 29 (e.g., the width of a base of a connection post 29)]. A connection post 29 can have a height that is greater than a dimension of the first surface or a height that is greater than a dimension of the second opposing surface. A connection post 29 can have a sharp point.

In some embodiments, a semiconductor structure 99 includes a plurality of completed semiconductor devices 22 each of which has at least one individual tether 36 physically connected to at least one individual anchor 38. In some embodiments, at least two of the plurality of completed semiconductor devices 22 are physically connected to a common structure comprising at least one tether 36 for each completed semiconductor device 22. In some embodiments, a semiconductor structure 99 comprises at least one common anchor structure 39 to which a plurality of completed semiconductor structures 22 are physically connected, each by at least one tether 36. In some embodiments, at least two of a plurality of completed semiconductor devices 22 are physically connected to a common anchor structure 39 that is a ridge of material (e.g., that physically connects to each of two or more completed semiconductor devices 22 at an interface that is a tether 36).

Figure 10C:
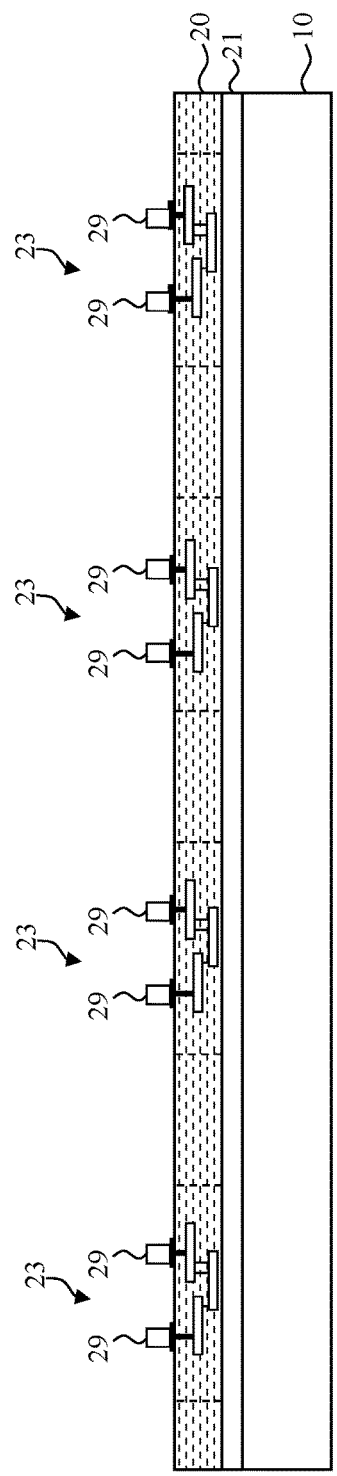
FIGS. 10A-10O are successive cross sections illustrating sequential steps in an exemplary method according to illustrative embodiments of the present invention.
Figure 10D:
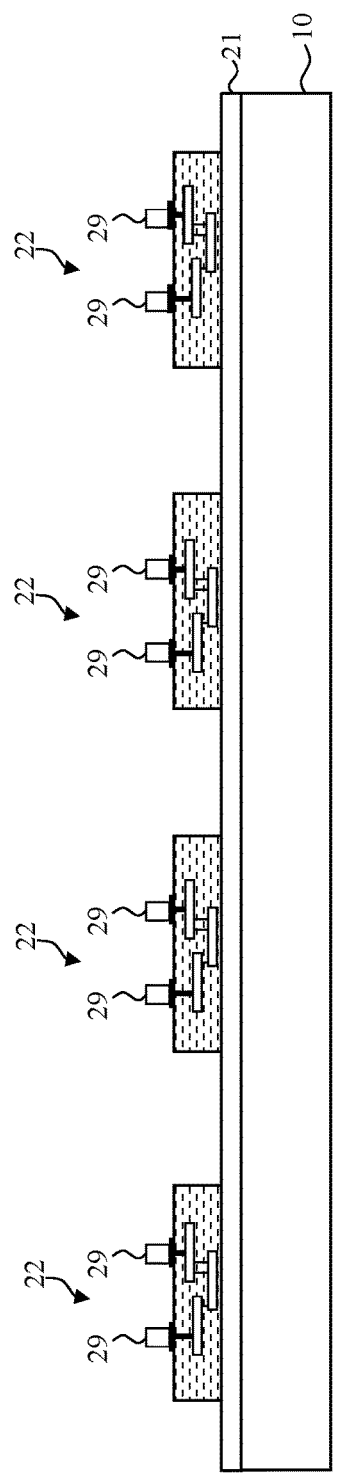
Figure 10E:
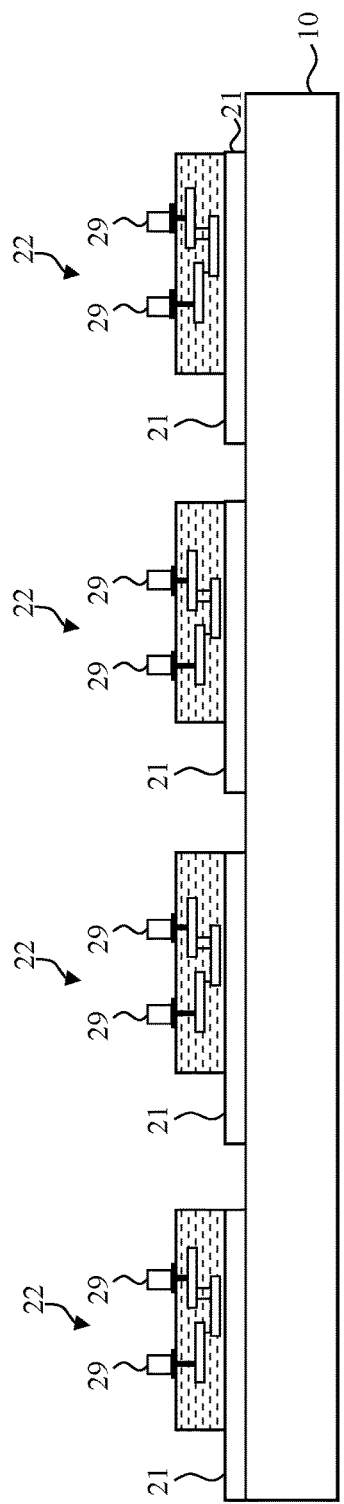
Figure 10F:
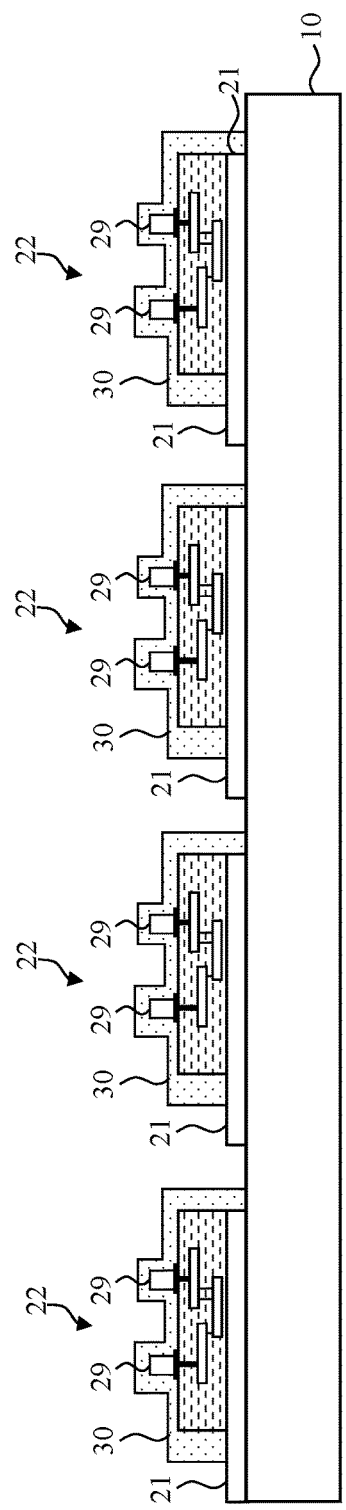
Figure 10G:
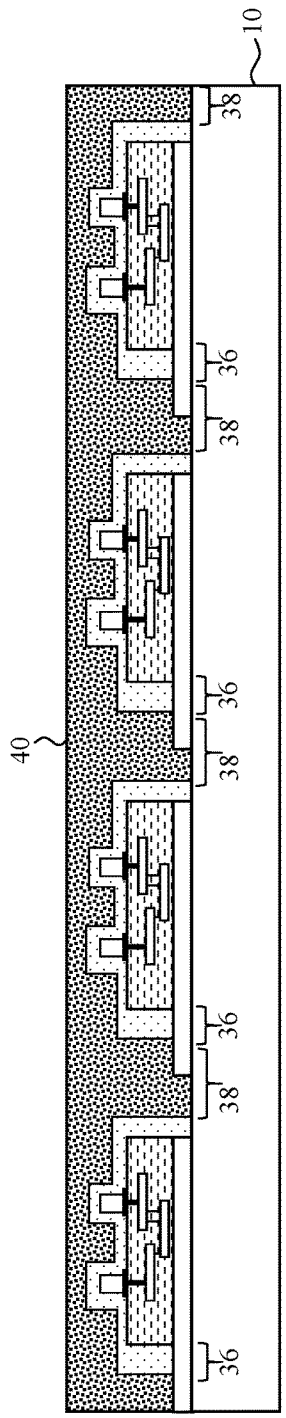
Figure 10H:
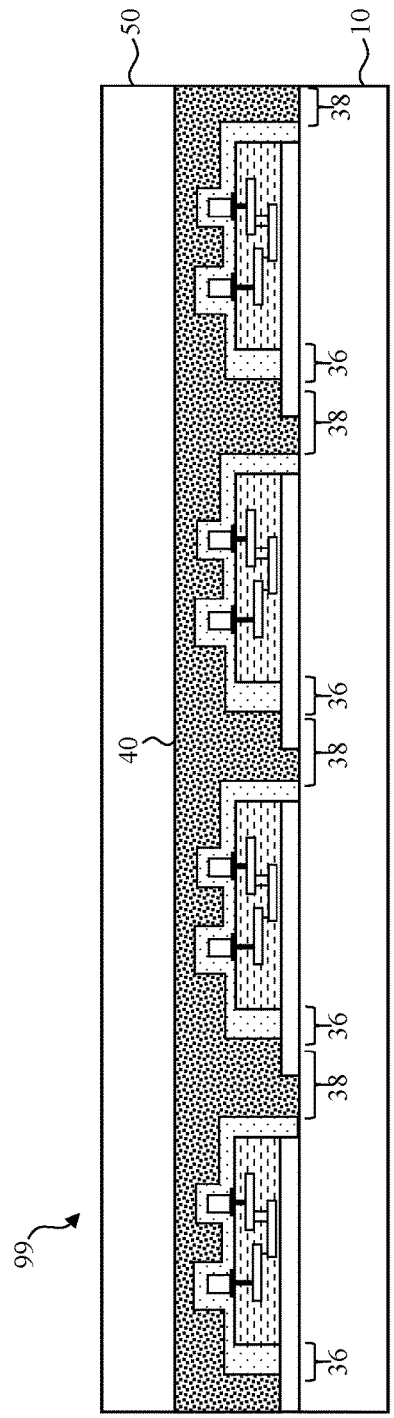
Figure 10I:
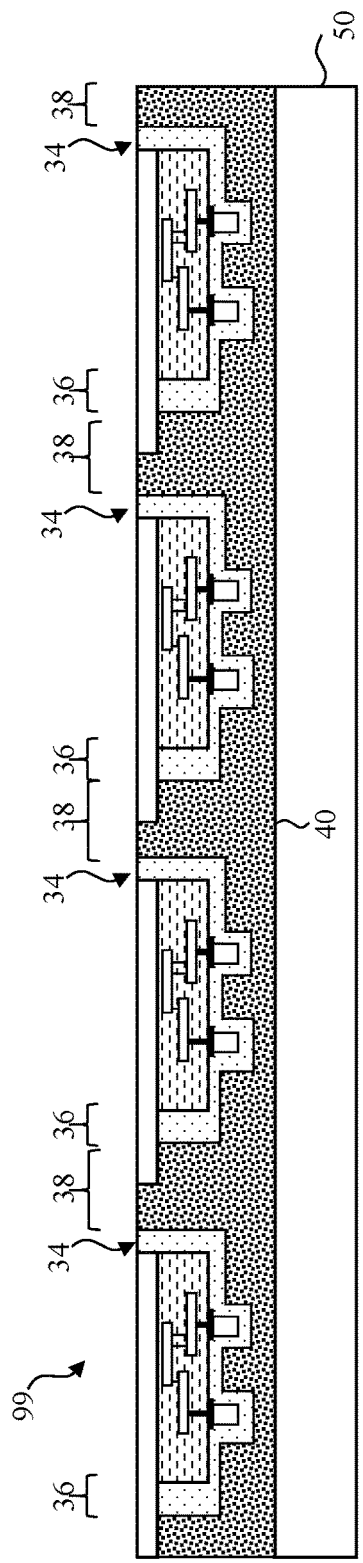
Figure 10J:
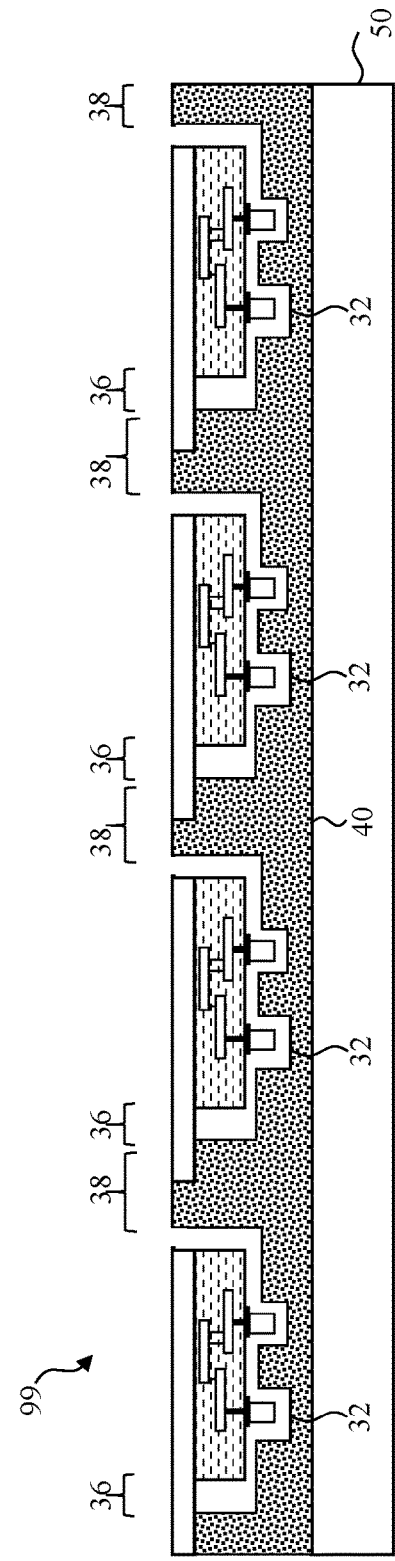
Figure 10M:
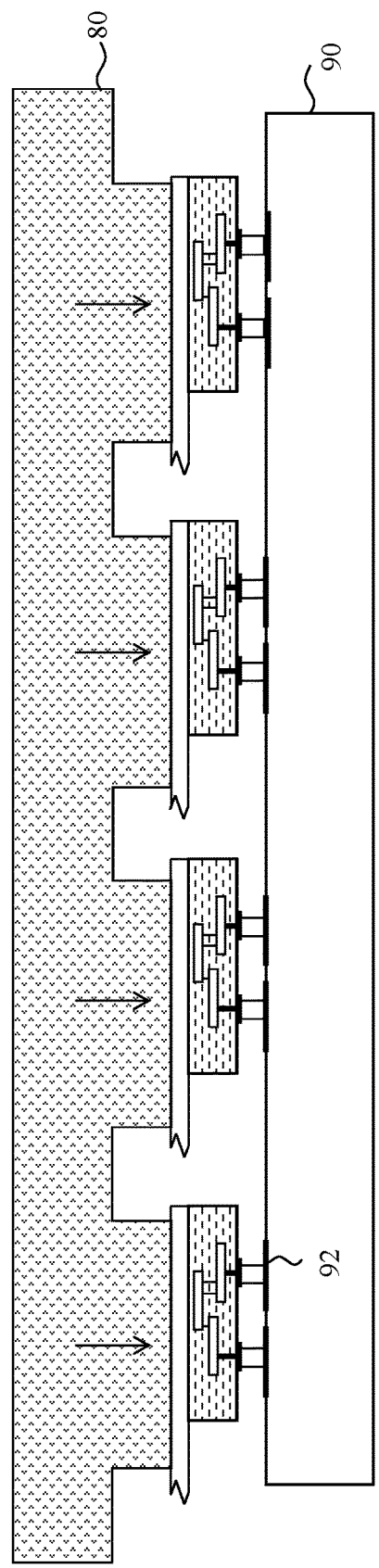
Figure 10N:
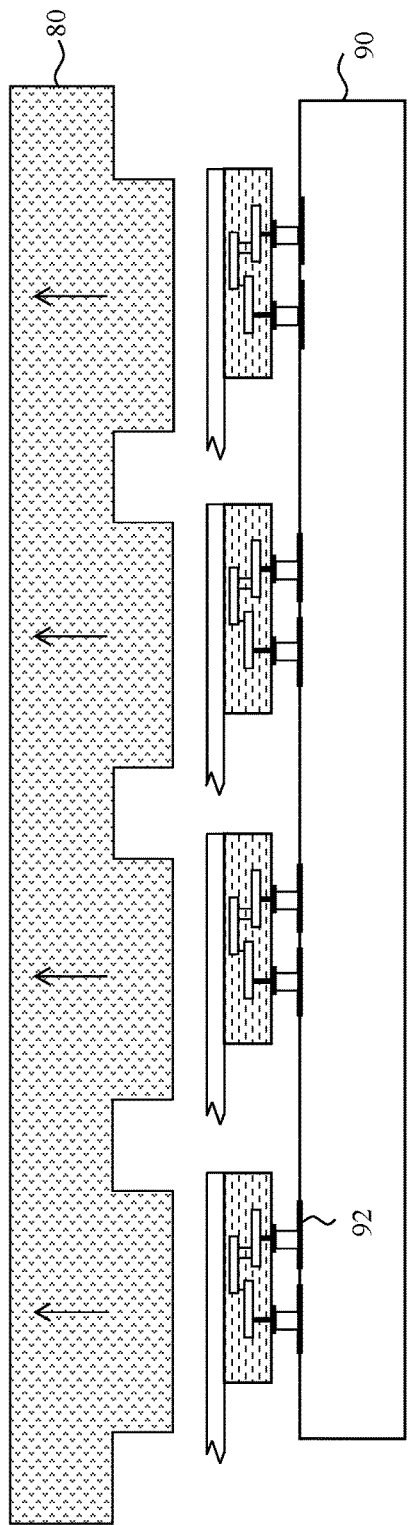
Figure 10O:
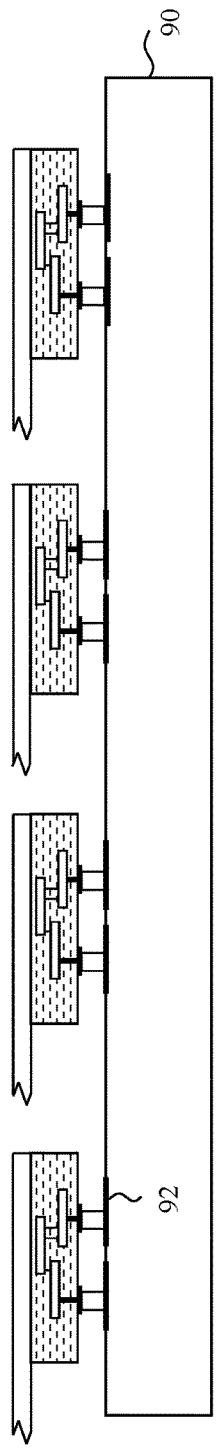

In some embodiments of the present invention, and referring to FIGS. 10A-10O and also described above, a semiconductor structure 99 suitable for transfer printing (e.g., micro-transfer printing) comprises a handle substrate 50, a bonding layer 40 disposed in contact with the handle substrate 50, and a patterned release layer 30 disposed in contact with the bonding layer 40, wherein a portion of the patterned release layer 30 is exposed, for example exposed to the atmosphere or processing chemicals, reagents, plasmas, gases, or etchants, for example as shown in FIG. 10I. The exposed portion of a patterned release layer 30 can form an entry path 34 (as shown in FIGS. 10I, 2H, described further below). A plurality of completed semiconductor devices 22 are disposed on or over the patterned release layer 30 and are each attached to an anchor 38 disposed on a handle substrate 50, e.g. a portion of a bonding layer 40, with at least one tether 36. Each completed semiconductor device 22 comprises at least one electrical contact 25 on a side of the completed semiconductor device 22 between the completed semiconductor device 22 and the handle substrate 50 (e.g., as shown in FIG. 10D). A connection post 29 is disposed on each electrical contact 25 and extends from the electrical contact 25 toward a handle substrate 50 (e.g., as shown in FIG. 10E). A patterned semiconductor support layer 21 comprises a surface on which is disposed a completed semiconductor devices 22. The surface is also in contact with a portion of a patterned release layer 30.

In some embodiments of the present invention, a semiconductor structure 99 comprises a support substrate 10 in contact with a semiconductor support layer 21, for example as shown in FIG. 10G and 10H. In some embodiments, a support substrate 10 comprises a removal layer 26, for example as shown in FIG. 2A. In some such embodiments, a portion of a patterned release layer 30 is in contact with a support substrate 10, a layer on a support substrate 10, or a removal layer 26.

In some embodiments of the present invention and also as described above, a portion of a completed semiconductor device 22 or a semiconductor support layer 21 is a removal layer, or a semiconductor structure comprises a removal layer in contact with a completed semiconductor device 22.

In some embodiments of the present invention, as shown in FIG. 10I and as discussed above (for example with respect to FIG. 1G), a patterned release layer 30 defines a gap 32 between a completed semiconductor device 22 and a bonding layer 40. In some embodiments, and as illustrated in FIGS. 6B-6D, each connection post 29 is tapered or a connection post 29 has a height to width aspect ratio of greater than 1:1, or both.

Figure 11:
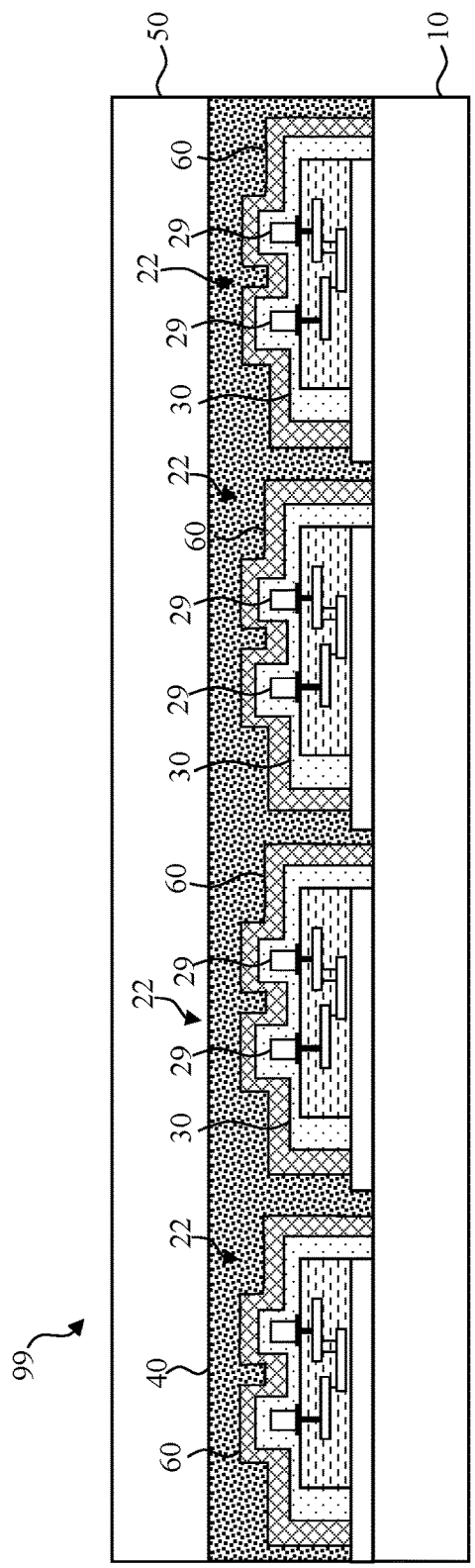
FIG. 11 is a cross section illustrating a completed semiconductor device according to illustrative embodiments of the present invention.

Referring in particular to FIGS. 10F-10I and to FIG. 11, in some embodiments of the present invention, a semiconductor structure 99 suitable for transfer printing (e.g., micro-transfer printing) comprises a handle substrate 50, a bonding layer 40 disposed in contact with the handle substrate 50, a capping layer 60 disposed in contact with the bonding layer 40, and a patterned release layer 30 disposed in contact with the capping layer 60, wherein a portion of the patterned release layer 30 is exposed, for example exposed to the atmosphere or, if the source substrate 10 is still present, a portion of the patterned release layer 30 is in contact with the source substrate 10 (e.g., such that the portion of the patterned release layer 30 will be exposed to the atmosphere when the source substrate 10 is removed). The illustration of FIG. 1I corresponds FIG. 10H in that a similar process of forming semiconductor structure 99 in accordance with FIG. 10A-10O can be used to form and print from the semiconductor structure 99 shown in FIG. 11. An exposed portion of a patterned release layer 30 can form an entry path 34 (as shown in FIG. 10H). A plurality of completed semiconductor devices 22 are disposed on or over a patterned release layer 30 and are each attached to at least one anchor 38 disposed on a handle substrate 50 (e.g. a portion of a bonding layer 40) with at least one tether 36. Each completed semiconductor device 22 comprises at least one electrical contact 25 on a side of the completed semiconductor device 22 between the completed semiconductor device 22 and a handle substrate 50. A connection post 29 is disposed on each electrical contact 25 and extends from the electrical contact 25 toward the handle substrate 50. The connection post 29 can have a sharp point. A patterned semiconductor support layer 21 comprises a surface on which is disposed completed semiconductor devices 22 and the surface is in contact with a portion of a patterned release layer 30.

In some embodiments of the present invention, a semiconductor structure 99 comprises a support substrate 10 in contact with a semiconductor support layer 21, for example as shown in FIG. 10G. In some embodiments, a support substrate 10 comprises a removal layer 26, for example as shown in FIG. 2A. In some such embodiments, a portion of a patterned release layer 30 is in contact with a support substrate 10, a layer on the support substrate 10, or a removal layer 26.

In some embodiments of the present invention and also as described above, a portion of a completed semiconductor device 22 or a semiconductor support layer 21 is a removal layer, or the semiconductor structure 99 comprises a removal layer in contact with the completed semiconductor device 22.

In some embodiments of the present invention, as shown in FIG. 10I and as discussed above (for example with respect to FIG. 1G), a patterned release layer 30 defines a gap 32 between completed semiconductor devices 22 and a bonding layer 40 or capping layer 60. In some embodiments, and as illustrated in FIGS. 6B-6D, each connection post 29 is tapered or the connection post 29 has a height to width aspect ratio of greater than 1:1, or both.

Figure 12:
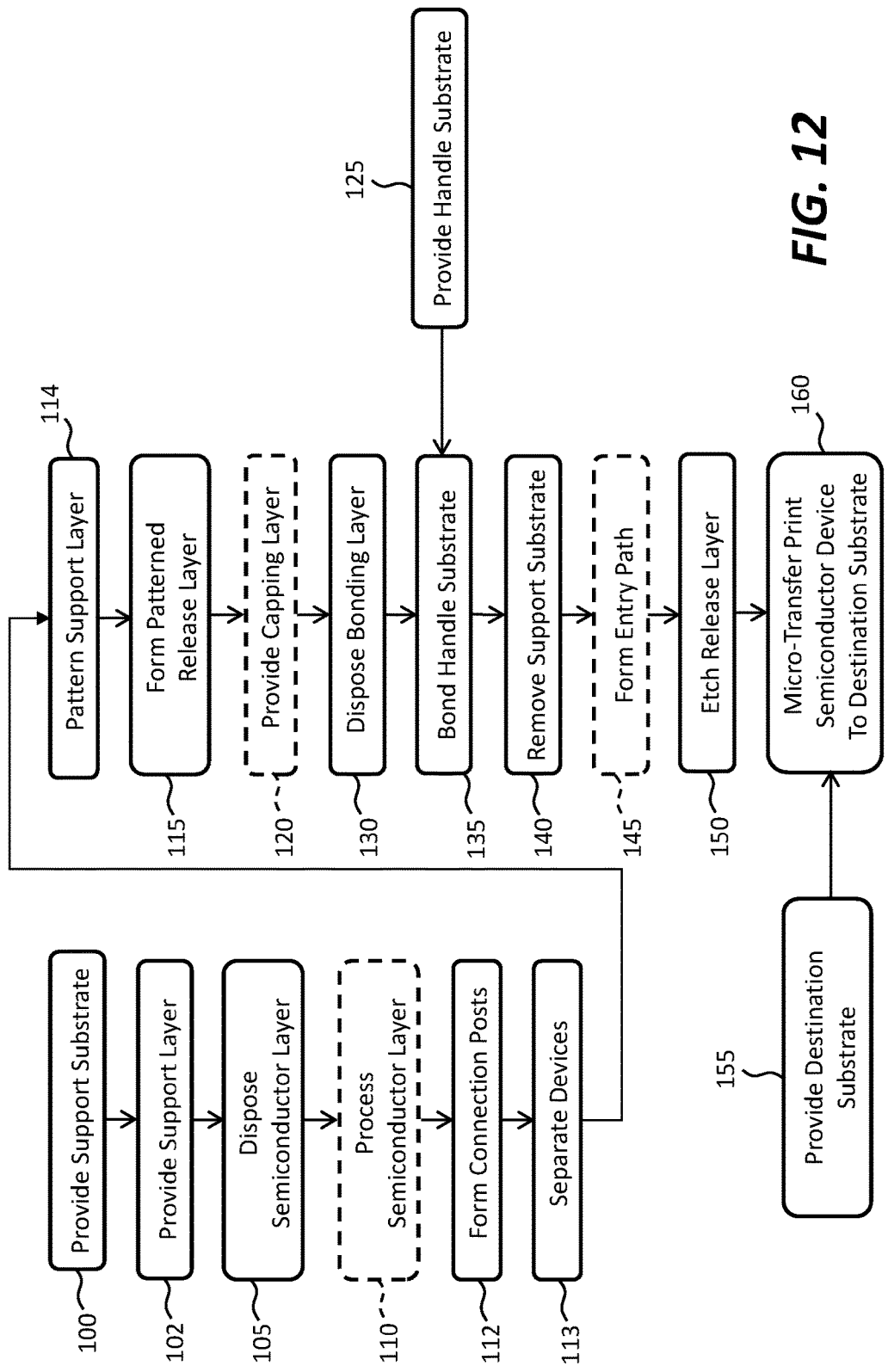
FIG. 12 is a flow chart illustrating exemplary methods, according to illustrative embodiments of the present invention.

Referring to FIGS. 10A-10O and also as described above with respect to FIGS. 1A-1J, 2A-2K, FIGS. 3A-3B, FIG. 4, and the flow chart of FIG. 12, a method of making a semiconductor structure 99 suitable for transfer printing, for example micro-transfer printing, comprises providing a support substrate 10 in step 100, providing a semiconductor support layer 21 over the support substrate 100 in step 102, providing a semiconductor layer 20 disposed over the semiconductor support layer 21 in step 105 (as shown in FIG. 10A), and optionally processing the semiconductor layer 20 in step 110 to form a plurality of semiconductor devices 23 disposed in, on, or over the semiconductor support layer 21, each of the semiconductor devices 23 having one or more electrical contacts 25 exposed on a side of the semiconductor device 23 opposite the semiconductor support layer 11 (as shown in FIG. 10B). A connection post 29 is formed on each of the exposed electrical contacts 25, the connection posts 29 extending in a direction away from the semiconductor support layer 10 in step 112 (as shown in FIG. 10C). The semiconductor layer 20 is processed, for example by pattern-wise etching, by exposure to a developer, or by exposure to oxygen plasma, to separate the semiconductor devices 23 and form a corresponding plurality of completed semiconductor devices 22 in step 113 (as shown in FIG. 10D). Similarly, the semiconductor support layer 21 is patterned, for example by pattern-wise etching, to expose a portion of the support substrate 10 in step 114 (FIG. 10E).

A patterned release layer 30 is formed on or over the completed semiconductor devices 22 in step 115 (FIG. 10F), the patterned release layer 30 (i) in contact with portions of the patterned semiconductor support layer 21 on which the complete semiconductor devices 22 are disposed and (ii) in contact with at least a portion of the support substrate 10. An optional capping layer 60 is provided in step 120 (as shown in FIG. 11) over the patterned release layer 30. Referring to FIGS. 10G and 10H, a handle substrate 50 is provided (step 125) and a conformable bonding layer 40 is disposed on the patterned release layer 30 or on the capping layer 60, if present, or on the handle substrate 50 in step 130 (as shown in FIG. 10G). The bonding layer 40 can be a curable bonding layer, for example a UV-curable or heat-curable resin or a metal or metal alloy layer that can be cured by heating the metal or metal alloy, disposing a structure in contact with the melted metal or metal alloy, and then cooling the metal. The handle substrate 50 is bonded to the patterned release layer 30 (or the capping layer 60, if present) with the bonding layer 40 in step 135 (as shown in FIG. 10H). In step 140, the support substrate 10 is removed to expose the patterned semiconductor support layer 21 where it was in contact with the support substrate 10 (as shown in FIG. 10I), or expose the completed semiconductor devices 22.

In some embodiments of the present invention, the optional capping layer has a suitable thickness so that the optional capping layer 60 disperses, deflects, reflects, or absorbs a shock wave produced by laser ablation of at least a portion of the support substrate or semiconductor support layer. For example, the optional capping layer 60 can have a thickness greater than the thickness of the patterned release layer 30. The optional capping layer 60 can have a thickness of about 40,000 Angstroms (e.g., between 30,000 Angstroms and 50,000 Angstroms). In some embodiments, the capping layer 60 is a stiffener or is also a stiffener that helps to protect the completed semiconductor devices 22 from mechanical stress during the removal of the support substrate 10 or during a micro-transfer print process.

If the patterned release layer 30 is not exposed, an entry path 34 can be formed, for example by pattern-wise etching. In some embodiments of the present invention, at least a portion of the patterned release layer 30 is removed in step 150, for example by etching, to form a gap 32 between at least a portion of the completed semiconductor devices 22 and at least a portion of the bonding layer 40 or capping layer 60, if present (as shown in FIG. 10J). The removal step 150 also forms a tether 36 physically connecting the completed semiconductor device 22 to an anchor 38 disposed on the handle substrate 50, for example a portion of the bonding layer 40. In some embodiments, the anchors 38 are disposed laterally between completed semiconductor devices 22 and each tether 36 extends laterally from a completed micro-device to an anchor 38. The tethers 36 can be in a common plane with the entry path 34. In some embodiments, each tether 36 is a portion of the semiconductor support layer 21.

Referring to FIG. 10K, in step 160, the completed semiconductor devices 22 are contacted with a stamp 80 and the stamp 80 is removed from the handle substrate 50 to adhere the completed semiconductor devices 22 to the stamp 80, thereby fracturing the tethers 36 to make a fractured tether 37 (as shown in FIG. 10L). The stamp 80 and completed semiconductor devices 22 are transported to a destination substrate 90 (provided in step 155) and the completed semiconductor devices 22 are contacted to the destination substrate 90 with the connection posts 29 electrically in contact with the contact pads 92 (as shown in FIG. 10M). The stamp 80 is then removed (as shown in FIG. 10N) leaving the completed semiconductor devices 22 micro-transfer printed from the handle substrate 50 onto the destination substrate (as shown in FIG. 10O).

In some embodiments of the present invention, the support substrate 10 is removed (step 140) by one or more of laser liftoff, ablation, laser ablation, etching, and grinding, for example a fluorine-based dry etch with an optional grind first. The semiconductor support layer 21 can be or comprise an ablation layer or a removal layer. An etch-stop layer can be disposed between the completed semiconductor device 22 and the support substrate 10. The support substrate 10 can comprise a removal layer, for example a layer for absorbing laser light to dissociate the support substrate 10 from the semiconductor support layer 21.

Materials of the various elements of the semiconductor structure 99 constructed using the method described in FIGS. 10A-10O can be the same as or similar to those described in FIGS. 1A-1J or 2A-2K. The semiconductor support layer 21 can comprise a dielectric material that is differentially etchable from the support substrate 10 and can include patterned or unpatterned growth layers. For example, as with the support substrate 10, the semiconductor support layer 21 can comprise multiple layers, can include one or more semiconductor layers 20, can be a growth substrate, or can include a growth or semiconductor seed layer on which the one or more semiconductor layers 20 are formed or disposed. A semiconductor support layer 21 can be crystalline or have a crystalline layer. The handle substrate 50 can be a glass, ceramic, or semiconductor wafer, for example a silicon wafer.

Certain embodiments of the present invention provide, inter alia, methods and structures for making micro-transfer printable structures on a handle (or carrier) substrate using fewer process steps, with fewer layers, or with fewer process chemicals, and with less-stringent resolution requirements. Micro-transfer printable completed semiconductor devices 22 made by methods in accordance with some embodiments of the present invention can include one or more of a variety of semiconductor structures, including (for example, but not limited to) a diode, a light-emitting diode (LED), a laser (e.g., a diode laser), a photo-diode (e.g., solar cell), a photo-transistor, a transistor, a sensor, or an integrated circuit.

In some embodiments of the present invention, micro-transfer printable completed semiconductor devices 22 have a length greater than a width, for example having an aspect ratio greater than or equal to 2, 4, 8, 10, 20, or 50, and electrical contacts 25 that are adjacent to the ends of the completed semiconductor devices 22 along the length of the micro-transfer printable completed semiconductor devices 22. Completed semiconductor devices 22 can have a variety of different sizes. For example, in some embodiments, completed semiconductor devices 22 have at least one of a width from 2 to 5 µm, 5 to 10 µm, 10 to 20 µm, or 20 to 50 µm, a length from 2 to 5µm, 5 to 10 µm, 10 to 20 µm, or 20 to 50 µm, and a height from 2 to 5 µm, 4 to 10 µm, 10 to 20 µm, or 20 to 50 µm.

Methods of forming micro-transfer printable structures are described, for example, in the paper "AMOLED Displays using Transfer-Printed Integrated Circuits" (Journal of the Society for Information Display, 2011, DOI # 10.1889/JSID19.4.335, 1071-0922/11/1904-0335, pages 335-341) and U.S. Pat. No. 8,889,485, referenced above. For a discussion of micro-transfer printing techniques see, U.S. Pat. Nos. 8,722,458, 7,622,367 and 8,506,867, the disclosure of each of which is hereby incorporated by reference in its entirety. Micro-transfer printing using compound micro-assembly structures and methods can also be used with certain embodiments of the present invention, for example, as described in U.S. patent application Ser. No. 14/822,868, filed Aug. 10, 2015, entitled "Compound Micro-Assembly Strategies and Devices", the disclosure of which is hereby incorporated by reference in its entirety. Additional details useful in understanding and performing aspects of certain embodiments of the present invention are described in U.S. patent application Ser. No. 14/743,981, filed Jun. 18, 2015, entitled "Micro Assembled LED Displays and Lighting Elements", the disclosure of which is hereby incorporated by reference in its entirety.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST $D_S$ thickness/dimension
$D_L$ thickness/dimension
10 support substrate
20 semiconductor layer 21 semiconductor support layer
22 completed semiconductor device
23 semiconductor device
24 dielectric layer
25 electrical contact
26 removal layer
27, 27A, 27B electrode
29 connection post
30 release layer
32 gap
34 entry path
36 tether
37 fractured tether
38 anchor
39 anchor structure
40 bonding layer
42 bonding layer planar side
44 non-planar bonding layer opposite side
50 handle substrate
60 capping layer
70 electromagnetic radiation
80 stamp
82 stamp pillar
90 destination substrate
92 contact pads
99 semiconductor structure
100 provide support substrate step
102 provide support layer
105 dispose semiconductor layer step
110 optional process semiconductor layer step
112 form connection posts
113 separate semiconductor devices
114 pattern semiconductor support layer
115 form patterned release layer step
120 optional provide capping layer step
125 provide handle substrate step
130 dispose bonding layer step
135 bond handle substrate step
140 remove support substrate step
145 optional form entry path step
150 etch release layer step
155 provide destination substrate step
160 micro-transfer print semiconductor device to destination substrate step

What is claimed:

1. A method of making a semiconductor structure suitable for transfer printing, comprising:
providing a support substrate;
providing a semiconductor support layer over the support substrate;
providing a semiconductor layer disposed over the semiconductor support layer;
forming a plurality of semiconductor devices disposed in, on, or over the semiconductor support layer, each of the semiconductor devices comprising one or more electrical contacts exposed on a side of the semiconductor device opposite the semiconductor support layer;
forming a connection post on each of the exposed electrical contacts, the connection posts extending in a direction away from the semiconductor support layer;
patterning the semiconductor layer to separate the semiconductor devices in order to form a corresponding plurality of completed semiconductor devices;
patterning the semiconductor support layer to expose a portion of the support substrate;
forming a patterned release layer on or over the plurality of completed semiconductor devices, the patterned release layer (i) in contact with portions of the patterned semiconductor support layer on which the complete semiconductor devices are disposed and (ii) in contact with at least a portion of the support substrate;
providing a handle substrate;
disposing a conformable bonding layer on the patterned release layer or on the handle substrate;
bonding the handle substrate to the patterned release layer with the bonding layer; and
removing the support substrate to expose at least a portion of the patterned semiconductor support layer.

2. The method of claim 1, comprising:
disposing a capping layer over the patterned release layer, wherein the capping layer disperses, deflects, reflects, or absorbs a shock wave produced by laser ablation of at least a portion of the support substrate or semiconductor support layer.

3. The method of claim 1, comprising:
removing at least a portion of the patterned release layer to form a gap between at least a portion of the completed semiconductor device and at least a portion of the bonding layer; and
forming tethers physically connecting the plurality of completed semiconductor devices to anchors disposed on the handle substrate.

4. The method of claim 3, wherein the anchors are disposed laterally between ones of the plurality of completed semiconductor devices and each of the tethers extends laterally from one of the completed micro-device to one of the anchors.

5. The method of claim 3, wherein each of the tethers is a portion of the semiconductor support layer.

6. The method of claim 3, comprising micro-transfer printing the completed semiconductor devices from the handle substrate to a destination substrate and electrically contacting the connection posts to corresponding electrical contact pads on the destination substrate.

7. The method of claim 1, wherein removing the support substrate comprises one or more of laser liftoff, ablation, laser ablation, etching, and grinding.

8. The method of claim 1, wherein the semiconductor support layer is an ablation layer, a removal layer, or an etch-stop layer disposed between the completed semiconductor device and the support substrate.

9. The method of claim 1, wherein removing the support substrate comprises removing a removal layer.

10. A semiconductor structure suitable for transfer printing, comprising:
a handle substrate;
a bonding layer disposed in contact with the handle substrate;
a patterned release layer disposed in contact with the bonding layer;
a plurality of completed semiconductor devices disposed on or over the patterned release layer and each attached to one or more anchors disposed on the handle substrate with at least one tether, each of the plurality of completed semiconductor devices comprising at least one electrical contact disposed on a side of the completed semiconductor device between the completed semiconductor device and the handle substrate;
a connection post disposed on each of the at least one electrical contacts and extending from the electrical contact toward the handle substrate; and
a patterned semiconductor support layer comprising a surface on which is disposed the plurality of completed semiconductor devices and wherein the surface is in contact with a portion of the patterned release layer.

11. The semiconductor structure of claim 10, wherein a portion of the patterned release layer is exposed.

12. The semiconductor structure of claim 10, wherein a portion of the plurality of completed semiconductor devices or the semiconductor support layer is or comprises a removal layer.

13. The semiconductor structure of claim 10, comprising a support substrate in contact with the patterned semiconductor support layer and in contact with a portion of the patterned release layer.

14. The semiconductor structure of claim 12, wherein the support substrate comprises a removal layer.

15. The semiconductor structure of claim 10, wherein the patterned release layer defines a gap between the plurality of completed semiconductor devices and the bonding layer.

16. A semiconductor structure suitable for transfer printing, comprising:
    a handle substrate;
    a bonding layer disposed in contact with the handle substrate;
    a capping layer disposed in contact with the bonding layer;
    a patterned release layer disposed in contact with capping layer;
    a plurality of completed semiconductor devices disposed on or over the patterned release layer and each attached to at least one anchor disposed on the handle substrate with at least one tether, each of the plurality of completed semiconductor devices comprising at least one electrical contact disposed on a side of the completed semiconductor device between the completed semiconductor device and the handle substrate;
    a connection post disposed on each of the at least one electrical contacts and extending from the electrical contact toward the handle substrate; and
    a patterned semiconductor support layer comprising a surface on which is disposed the completed semiconductor devices and wherein the surface is in contact with a portion of the patterned release layer.

17. The semiconductor structure of claim 16, wherein a portion of the patterned release layer is exposed.

18. The semiconductor structure of claim 16, wherein a portion of the plurality of completed semiconductor devices or the semiconductor support layer is a removal layer, or the semiconductor structure comprises a removal layer in contact with the completed semiconductor device.

19. The semiconductor structure of claim 16, comprising a support substrate in contact with the semiconductor support layer and in contact with a portion of the patterned release layer.

20. The semiconductor structure of claim 19, wherein the support substrate comprises a removal layer.

* * * * *